(12) United States Patent
Woody et al.

(10) Patent No.: US 11,274,178 B2
(45) Date of Patent: Mar. 15, 2022

(54) HIGH PERFORMANCE WIDE-BANDGAP POLYMERS FOR ORGANIC PHOTOVOLTAICS

(71) Applicant: PHILLIPS 66 COMPANY, Houston, TX (US)

(72) Inventors: Kathy Woody, Bartlesville, OK (US); Laura Nielsen, Bartlesville, OK (US); Hualong Pan, Bartlesville, OK (US); Taeshik Earmme, Seoul (KR)

(73) Assignee: Phillips 66 Company, Houston, TX (US)

( * ) Notice: Subject to any disclaimer, the term of this patent is extended or adjusted under 35 U.S.C. 154(b) by 0 days.

(21) Appl. No.: 16/038,364

(22) Filed: Jul. 18, 2018

(65) Prior Publication Data

US 2020/0024386 A1 Jan. 23, 2020

(51) Int. Cl.
*C08G 61/12* (2006.01)
*H01L 51/00* (2006.01)
*H01L 51/42* (2006.01)

(52) U.S. Cl.
CPC ........ *C08G 61/126* (2013.01); *H01L 51/0036* (2013.01); *H01L 51/0043* (2013.01);
(Continued)

(58) Field of Classification Search
CPC ............ H01L 51/0036; H01L 51/0047; C08G 2261/3243; C08G 2261/414; C08G 2261/124; C08G 2261/91
See application file for complete search history.

(56) References Cited

U.S. PATENT DOCUMENTS

2012/0071617 A1 3/2012 Dueggeli et al.
2013/0092912 A1 4/2013 You
(Continued)

OTHER PUBLICATIONS

Zu-Sheng Huang, Xu-Feng Zang, Tao Hua, Lingyun Wang, Hebert Meier, and Derong Cao, 2,3-Dipentyldithieno[3,2-f:2',3'-h]quinoxaline-Based Organic Dyes for Efficient Dye-Sensitized Solar Cells: Effect of π-Bridges and Electron Donors on Solar Cell Performance, Applied Materials & Interfaces, Research Article, 2015 American Chemical Society, vol. 7, pp. 20418-20429.
(Continued)

*Primary Examiner* — Shane Fang
(74) *Attorney, Agent, or Firm* — Phillips 66 Company

(57) ABSTRACT

A copolymer comprising a repeat unit A, wherein repeat unit A comprises

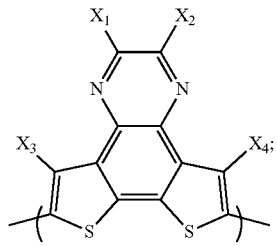

(Continued)

CONVENTIONAL
DEVICE ARCHITECTURE

INVERTED
DEVICE ARCHITECTURE a repeat unit B, wherein repeat unit B comprises

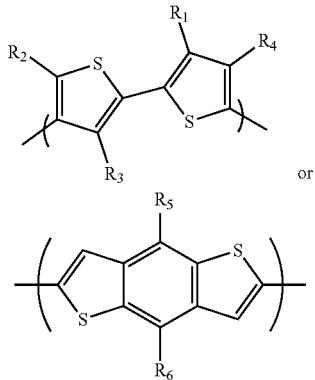

or and
at least one optional repeat unit D, wherein repeat unit D comprises an aryl group. In this copolymer, $X_1$, $X_2$, $X_3$, and $X_4$ are independently selected from the group consisting of: H, Cl, F, CN, alkyl, alkoxy, ester, ketone, amide and aryl groups and $R_1$, $R_2$, $R_3$, $R_4$, $R_5$ and $R_6$ are independently selected from the group consisting of: H, Cl, F, CN, alkyl, alkoxy, alkylthio, ester, ketone and aryl groups.

15 Claims, 14 Drawing Sheets

(52) U.S. Cl.
CPC .......... C08G 2261/124 (2013.01); C08G 2261/1412 (2013.01); C08G 2261/18 (2013.01); C08G 2261/228 (2013.01); C08G 2261/3223 (2013.01); C08G 2261/3241 (2013.01); C08G 2261/3243 (2013.01); C08G 2261/3246 (2013.01); C08G 2261/91 (2013.01); H01L 51/42 (2013.01)

(56) References Cited

U.S. PATENT DOCUMENTS

| | | |
|---|---|---|
| 2013/0144065 A1 | 6/2013 | Mishra et al. |
| 2015/0041726 A1* | 2/2015 | He .......... C08G 75/06 252/500 |
| 2015/0349261 A1 | 12/2015 | Wang et al. |

OTHER PUBLICATIONS

Huaxing Zhou, Liquiang Yang, Shubin Liu, and Wei You, "A Tale of Current and Voltage: Interplay of Band Gap and Energy Levels of Conjugated Polymers in Bulk Heterojunction Solar Cells", Macromolecules Article 2010, vol. 43, pp. 1039010396.
PCT Notification of Transmittal of the International Search Report and the Written Opinion of the International Searching Authority, or the Declaration, International Application No. PCT/US2018/042724, International Filing Date Jul. 18, 2018, 11 pages.

* cited by examiner

HIGH PERFORMANCE WIDE-BANDGAP POLYMERS FOR ORGANIC PHOTOVOLTAICS

CROSS-REFERENCE TO RELATED APPLICATIONS

This application is a non-provisional application which claims the benefit of and priority to U.S. Provisional application Ser. No. 65/538,362 filed Jul. 28, 2017, entitled "High Performance Wide-Bandgap Polymers for Organic Photovoltaics", which is hereby incorporated by reference in its entirety.

STATEMENT REGARDING FEDERALLY SPONSORED RESEARCH OR DEVELOPMENT

None.

FIELD OF THE INVENTION

This invention relates to high performance wide-bandgap polymers for organic photovoltaics.

BACKGROUND OF THE INVENTION

Solar energy using photovoltaics requires active semiconducting materials to convert light into electricity. Currently, solar cells based on silicon are the dominating technology due to their high-power conversion efficiency. Recently, solar cells based on organic materials showed interesting features, especially on the potential of low cost in materials and processing.

Organic photovoltaic cells have many potential advantages when compared to traditional silicon-based devices. Organic photovoltaic cells are light weight, economical in the materials used, and can be deposited on low cost substrates, such as flexible plastic foils. However, organic photovoltaic devices typically have relatively low power conversion efficiency (the ratio of incident photons to energy generated). This is, in part, thought to be due to the morphology of the active layer. The charge carriers generated must migrate to their respective electrodes before recombination or quenching occurs. The diffusion length of an exciton is typically much less than the optical absorption length, requiring a tradeoff between using a thick, and therefore resistive, cell with multiple or highly folded interfaces, or a thin cell with a low optical absorption efficiency.

The first reported use of a quinoxalinedithiophene copolymer for organic photovoltaics was in 2008. One attractive feature of the quinoxalinedithiophene structure is that it can easily be functionalized with either bromine atoms or trimethylstannyl groups, thus allowing it to be copolymerized with a wide variety of co-monomers. There exists a need to find quinoxalinedithiophene co-polymers that are able to increase open circuit voltage.

BRIEF SUMMARY OF THE DISCLOSURE

A copolymer comprising a repeat unit A, wherein repeat unit A comprises

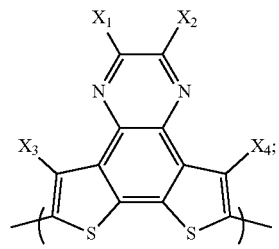

a repeat unit B, wherein repeat unit B comprises

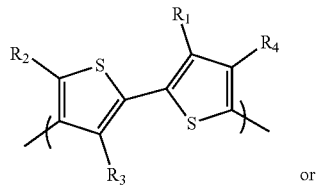

or

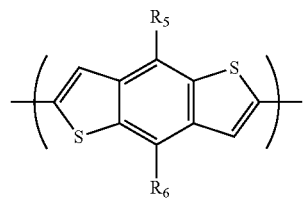

and at least one optional repeat unit D, wherein repeat unit D comprises an aryl group. In this copolymer, $X_1$, $X_2$, $X_3$, and $X_4$ are independently selected from the group consisting of: H, Cl, F, CN, alkyl, alkoxy, ester, ketone, amide and aryl groups and $R_1$, $R_2$, $R_3$, $R_4$, $R_5$ and $R_6$ are independently selected from the group consisting of: H, Cl, F, CN, alkyl, alkoxy, alkylthio, ester, ketone and aryl groups.

A copolymer comprising a repeat unit E, wherein repeat unit E comprises

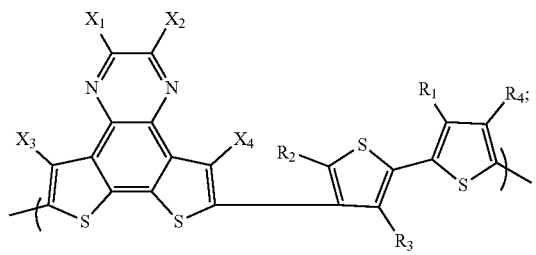

a repeat unit H, wherein repeat unit H comprises

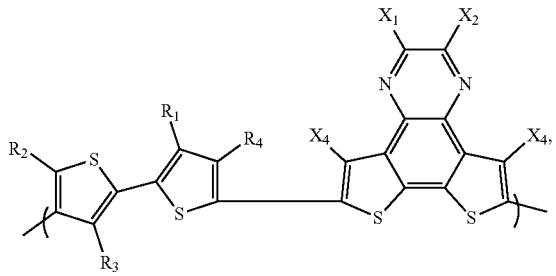

an optional repeat unit J, wherein a repeat unit J comprises

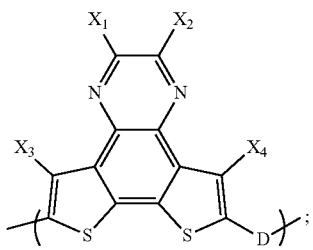

and a repeat unit K, wherein a repeat unit K comprises

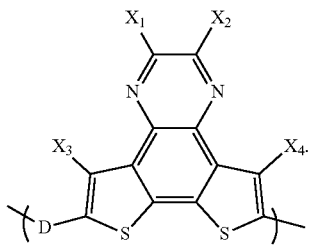

In this copolymer, $X_1$, $X_2$, $X_3$, and $X_4$ are independently selected from the group consisting of: H, Cl, F, CN, alkyl, alkoxy, ester, ketone, amide and aryl groups; $R_1$, $R_2$, $R_3$, and $R_4$ are independently selected from the group consisting of: H, Cl, F, CN, alkyl, alkoxy, alkylthio, ester, ketone and aryl groups; and D comprises an aryl group.

A copolymer comprising a repeat unit F, wherein repeat unit F comprises

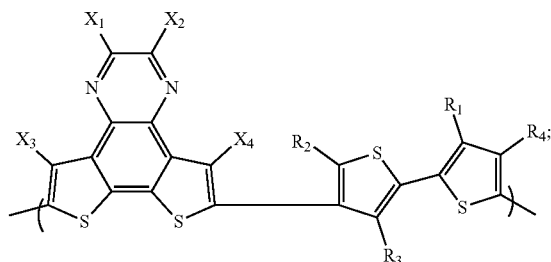

a repeat unit G, wherein repeat unit G comprises

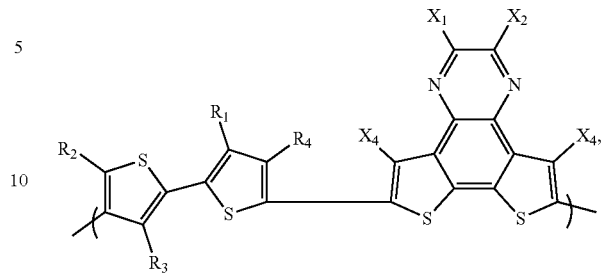

an optional repeat unit J, wherein a repeat unit J comprises

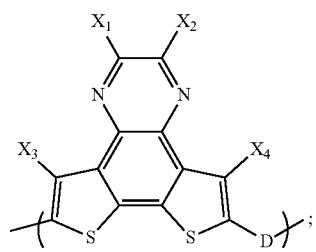

and a repeat unit K, wherein a repeat unit K comprises

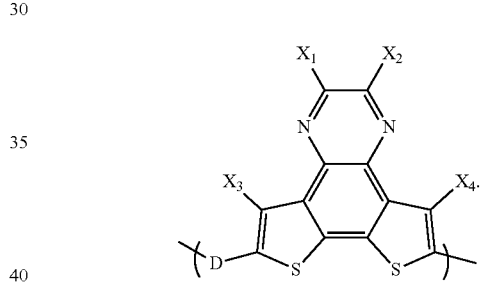

In this copolymer, $X_1$, $X_2$, $X_3$, and $X_4$ are independently selected from the group consisting of: H, Cl, F, CN, alkyl, alkoxy, ester, ketone, amide and aryl groups; $R_5$, and $R_6$ are independently selected from the group consisting of: H, Cl, F, CN, alkyl, alkoxy, alkylthio, ester, ketone and aryl groups; and D comprises an aryl group.

BRIEF DESCRIPTION OF THE DRAWINGS

A more complete understanding of the present invention and benefits thereof may be acquired by referring to the follow description taken in conjunction with the accompanying drawings in which.

DETAILED DESCRIPTION

Turning now to the detailed description of the preferred arrangement or arrangements of the present invention, it should be understood that the inventive features and concepts may be manifested in other arrangements and that the scope of the invention is not limited to the embodiments described or illustrated. The scope of the invention is intended only to be limited by the scope of the claims that follow.

"Alkyl," as used herein, refers to an aliphatic hydrocarbon chains. In one embodiment, the aliphatic hydrocarbon chains are of 1 to about 100 carbon atoms, preferably 1 to 30 carbon atoms, more preferably, 1 to 20 carbon atoms, and includes straight and branched chains such as methyl, ethyl, n-propyl, isopropyl, n-butyl, isobutyl, sec-butyl, t-butyl, n-pentyl, isopentyl, neo-pentyl, n-hexyl, and isohexyl. In this application alkyl groups can include the possibility of substituted and unsubstituted alkyl groups.

"Alkoxy," as used herein, refers to the group R—O— where R is an alkyl group of 1 to 100 carbon atoms. In this application alkoxy groups can include the possibility of substituted and unsubstituted alkoxy groups.

"Aryl" as used herein, refers to an optionally substituted, mono-, di-, tri-, or other multicyclic aromatic ring system having from about 5 to about 50 carbon atoms (and all combinations and subcombinations of ranges and specific numbers of carbon atoms therein), with from about 6 to about 10 carbons being preferred. Non-limiting examples include, for example, phenyl, naphthyl, anthracenyl, and phenanthrenyl. Aryl groups can be optionally substituted with one or with one or more Rx. In this application aryl groups can include the possibility of substituted aryl groups, bridged aryl groups and fused aryl groups.

"Ester", as used herein, represents a group of formula —COOR wherein R represents an "alkyl", "aryl", a "heterocycloalkyl" or "heteroaryl" moiety, or the same substituted as defined above "Ketone" as used herein, represents an organic compound having a carbonyl group linked to a carbon atom such as —C(O)Rx wherein Rx can be alkyl, aryl, cycloalkyl, cycloalkenyl or heterocycle.

"Amide" as used herein, represents a group of formula "—C(O)NR$^x$R$^y$," wherein R$^x$ and R$^y$ can be the same or independently H, alkyl, aryl, cycloalkyl, cycloalkenyl or heterocycle.

The following examples of certain embodiments of the invention are given. Each example is provided by way of explanation of the invention, one of many embodiments of the invention, and the following examples should not be read to limit, or define, the scope of the invention.

Device Architecture

Figure 1:
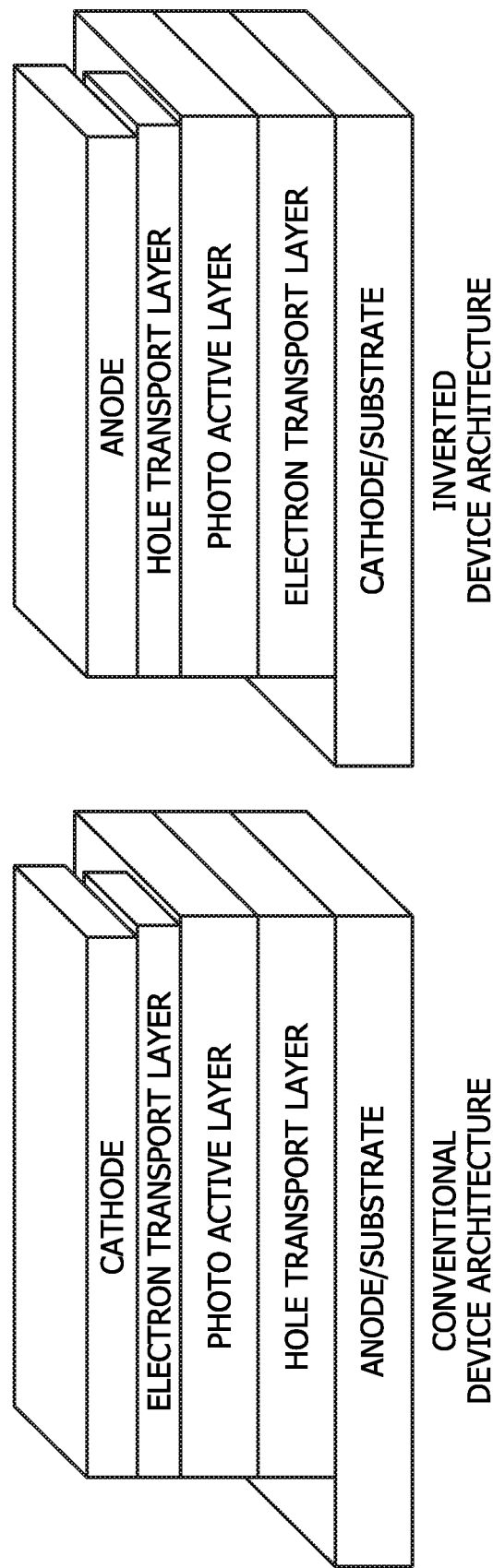
FIG. 1 depicts a conventional device architecture and an inverted device architecture.

When used as a photovoltaic device the architecture may be a conventional architecture device, while in others it may be an inverted architecture device. A conventional architecture device typically comprised of multilayered structure with a transparent anode as a substrate to collect positive charge (holes) and a cathode to collect negative charge (electrons), and a photo-active layer sandwiched in between two electrodes. An additional charge transport interlayer is inserted in between active layer and electrode for facile hole and electron transport. Each charge transport layer can be consisted of one or more layers. An inverted device has the same multilayered structure as the conventional architecture device whereas it uses a transparent cathode as a substrate to collect electrons and a cathode to collect holes. The inverted device also has the photo-active layer and additional charge transport layers sandwiched in between two electrodes. FIG. 1 depicts a conventional device architecture and an inverted device architecture.

Repeat Unit A:

In one embodiment repeat unit A are quinoxalinedithiophene (QDT) monomers

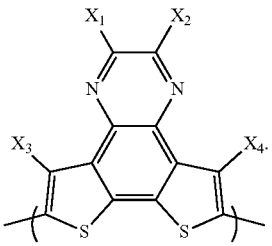

In repeat unit A, $X_1$, $X_2$, $X_3$, and $X_4$ are independently selected from the group consisting of: H, Cl, F, CN, alkyl, alkoxy, ester, ketone, amide and aryl groups.

The QDT monomer can be functionalized with a variety of halides and stannanes in order to prepare it for the eventual polymerization reaction. In one non-limiting example, the formation of a functionalized QDT monomer is shown in FIG. 2.

Figure 2:
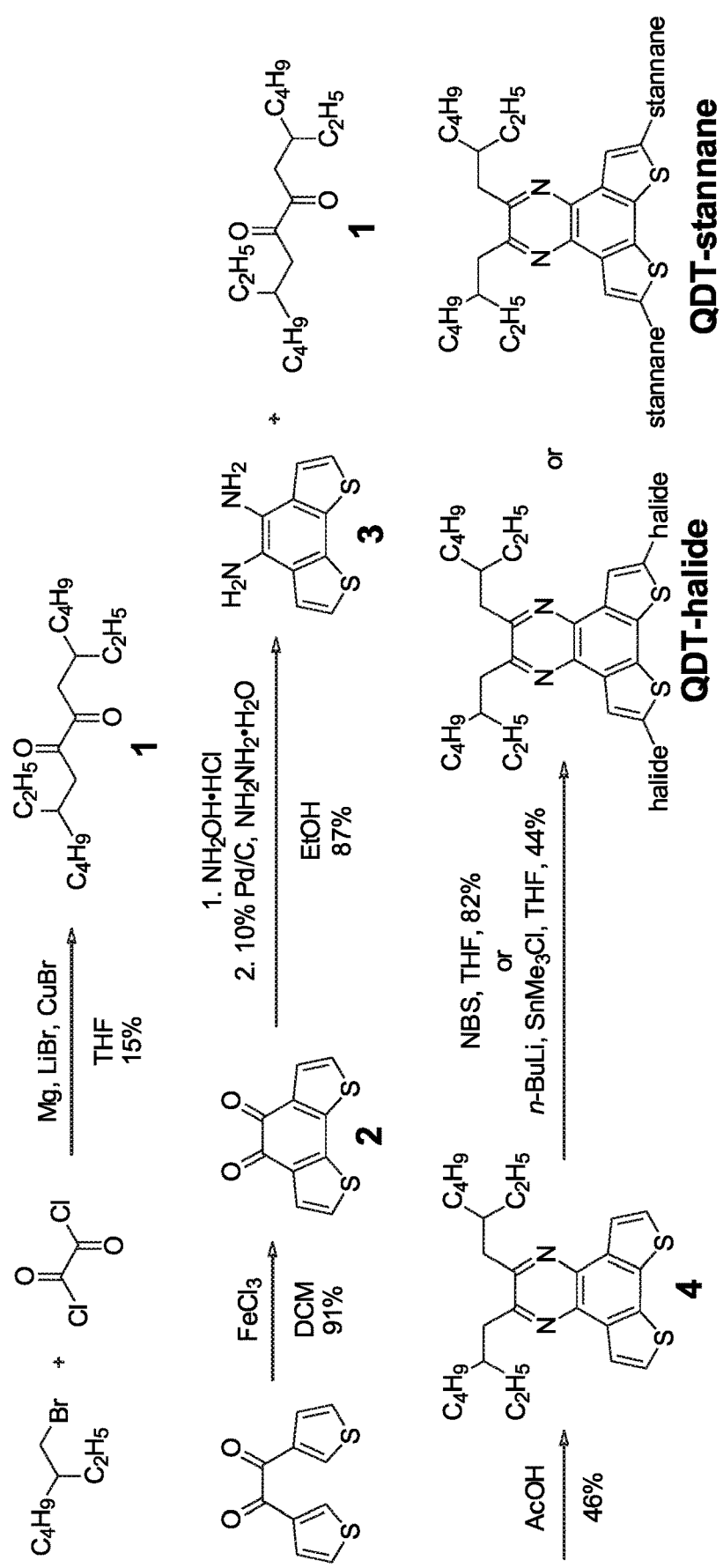
FIG. 2 depicts the formation of a functionalized QDT monomer.
Figure 3:
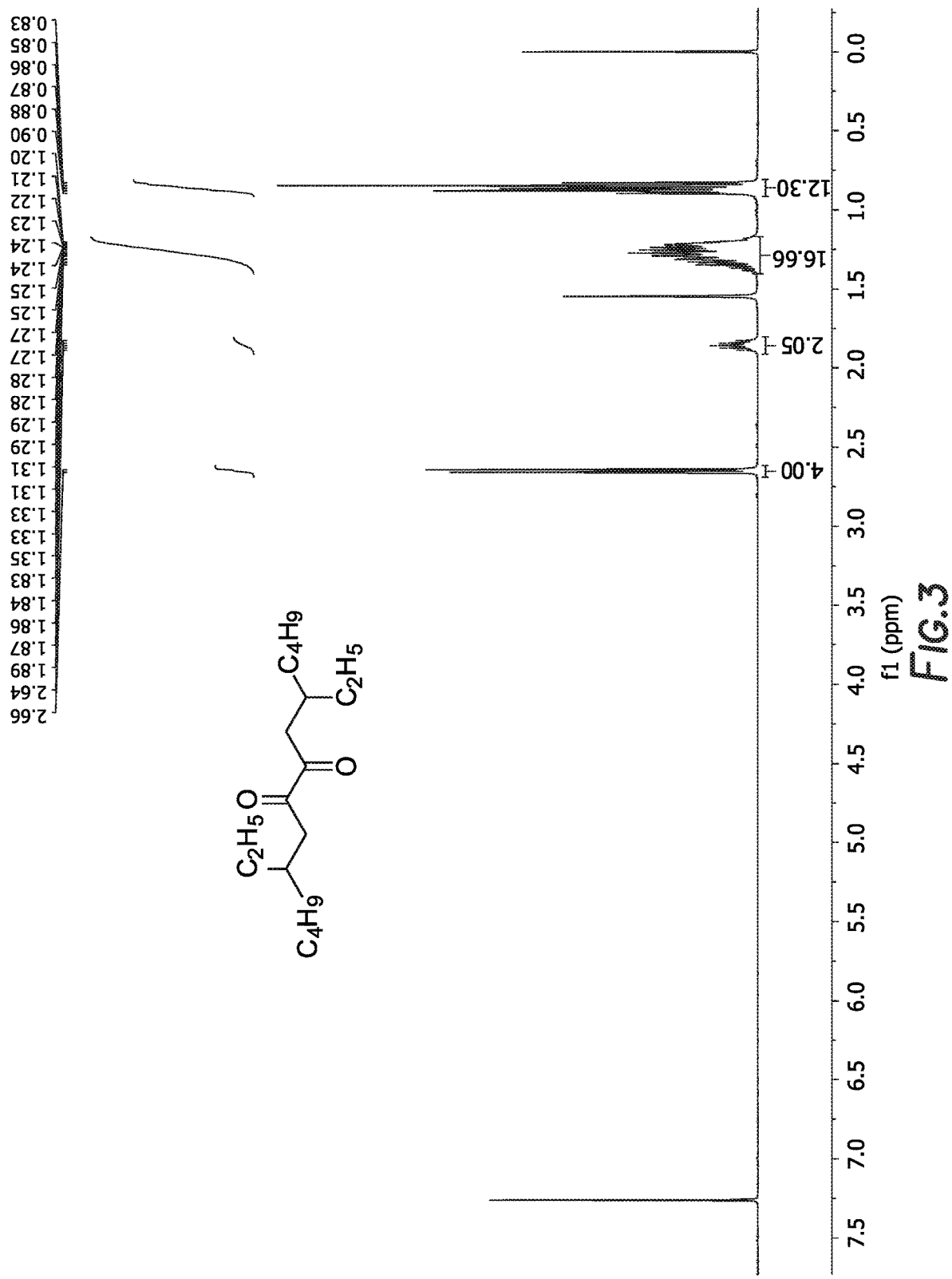
FIG. 3 depicts the $^1$H NMR spectrum of compound 1

As shown in FIG. 2, the formation of compound 1 begins by forming a 2-ethylhexylmagnesium bromide solution prepared by adding 2-ethylhexyl bromide (17.3 mL, 0.097 mol) dropwise to a mixture of freshly ground magnesium (2.61 g, 0.107 mol) in dry tetrahydrofuran (250 mL). Once the addition was complete, the 2-ethylhexylmagnesium bromide solution was stirred at room temperature for around 2 hours. Meanwhile, a solution of LiBr (17 g, 0.196 mol) in dry tetrahydrofuran (100 mL) was added to a solution of CuBr in dry tetrahydrofuran (150 mL). Then, the CuBr/LiBr/tetrahydrofuran solution was cooled to −78° C. and the 2-ethylhexylmagnesium bromide solution was added dropwise. Once that transfer was finished, oxalyl chloride (3.33 mL, 0.039 mol) was added. The reaction gradually warmed to room temperature and was stirred for around 18 hours. The reaction was quenched by pouring it into an aqueous saturated NH$_4$Cl solution (500 mL). The tetrahydrofuran layer was then removed and the aqueous layer was extracted with ethyl ether. The combined organic extracts were dried, filtered, and concentrated. The crude material was diluted with hexanes and loaded onto a 340 g Biotage cartridge, then purified with a 5-20% dichloromethane/hexanes gradient. Fractions containing product were concentrated to afford a yellow oil (1.63 g, 15% yield). The $^1$H NMR spectrum of compound 1 is shown in FIG. 3.

Figure 4:
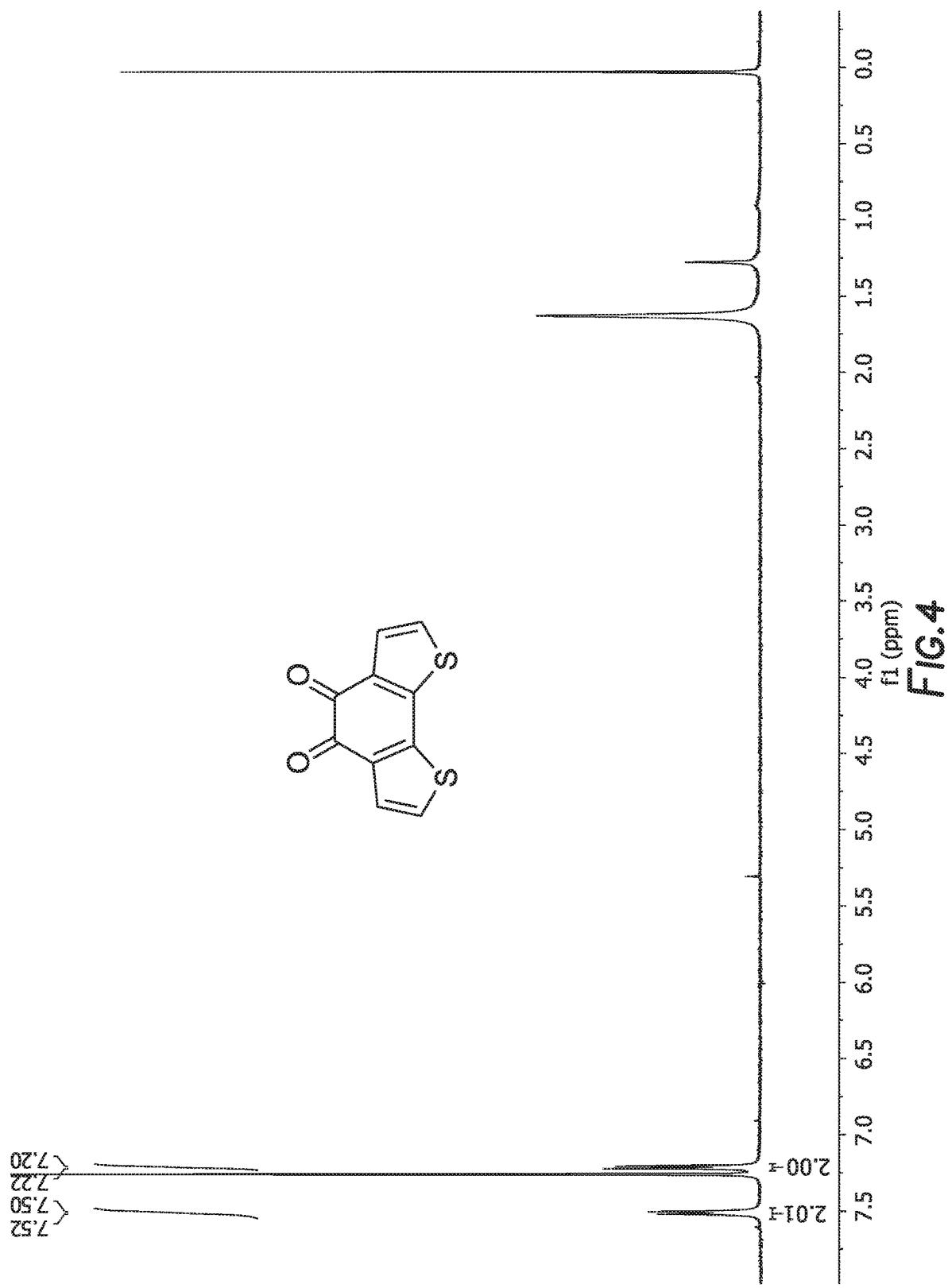
FIG. 4 depicts the $^1$H NMR spectrum of compound 2

The formation of compound 2 can be formed by charging a hot, oven-dried Schlenk flask with FeCl$_3$ (10.9 g, 67.481 mmol) then evacuated and refilled with argon (3×). Dry dichloromethane (140 mL) was added to the flask via cannula, and then 3,3'-thenil (5 g, 22.494 mmol) was added in one portion. The reaction stirred at room temperature under argon. After around 2 hours, the reaction was quenched with water (~100 mL) and stirred. The solvent was removed via rotovap, and the solid was suspended in water and left at room temperature overnight. The solid was filtered and washed with water, then air-dried, and washed with diethyl ether (~200 mL). The black solid was then recrystallized from acetonitrile. The resulting black solid (4.5 g, 91% yield) was collected by filtration, washed with acetonitrile, and dried under vacuum. The $^1$H NMR spectrum of compound 2 is shown in FIG. 4.

Figure 5:
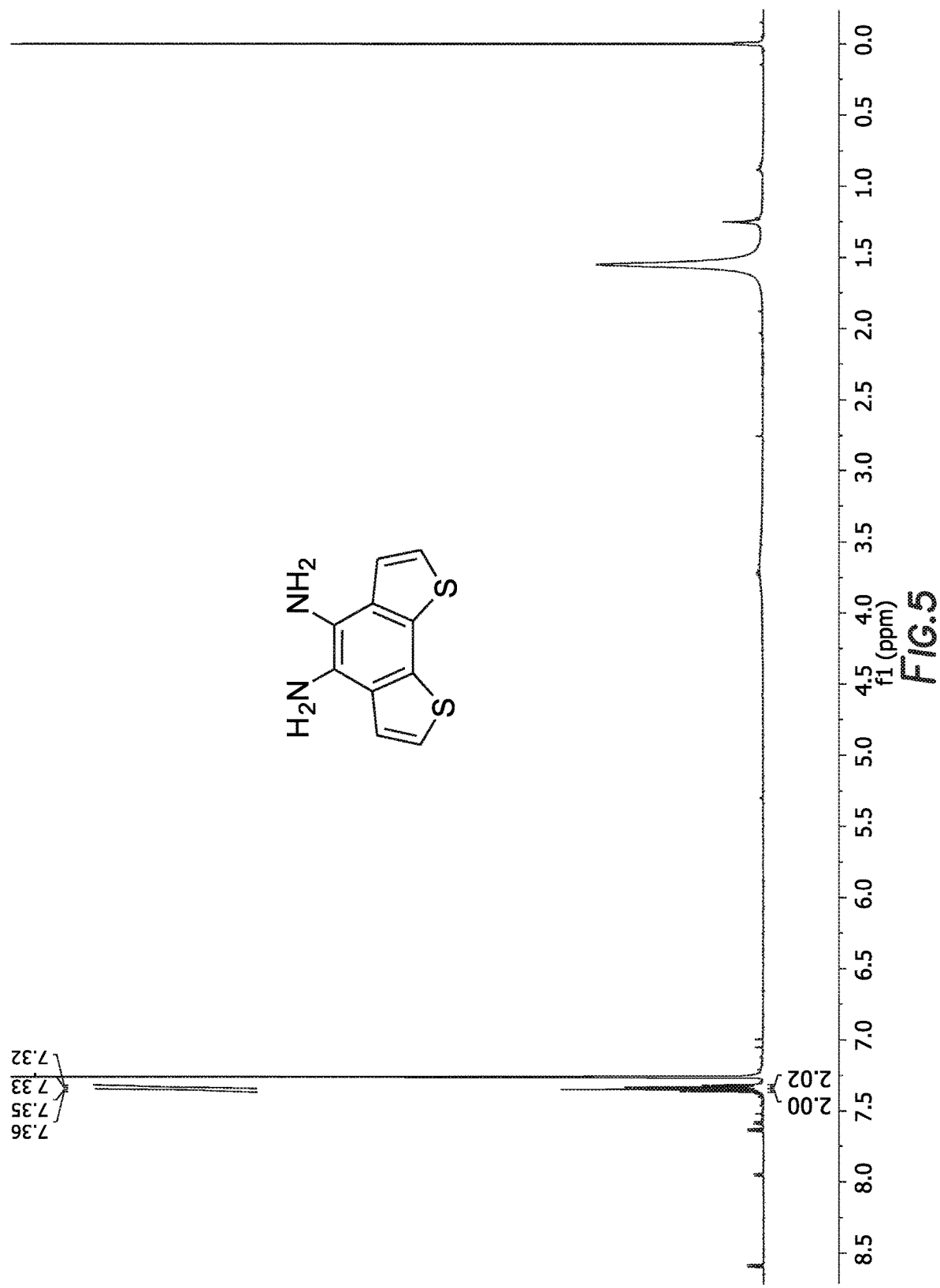
FIG. 5 depicts the $^1$H NMR spectrum of compound 3

The formation of compound 3 is formed by adding compound 2 (2 g, 0.009 mol), 200-proof ethanol (100 mL), and hydroxylamine hydrochloride (1.577 g, 0.023 mol) to a 250 mL round bottom flask under the flow of argon. The flask can then be topped with a water condenser and argon inlet, and the reaction was heated to reflux for 22 hours. The reaction can then be cooled to room temperature and 10% palladium on carbon (200 mg) is added. An addition funnel was added to the top of the condenser and the funnel was filled with a solution of hydrazine monohydrate (15 mL) in ethanol (25 mL). After heating the reaction to 65° C., the hydrazine solution was added dropwise. Once the addition was complete, the reaction was heated to 85° C. for 20 h. The reaction mixture was cooled, then filtered through filter paper, and the residue was washed with ethanol. The solvent was removed in vacuo and the resulting solid was dispersed in water and filtered. The solid was washed with water and cold ethanol, and then transferred to a flask and left under vacuum for a few hours. The resultant product was a tan solid (1.75 g, 87% yield). The $^1$H NMR spectrum of compound 3 is shown in FIG. 5.

Figure 6:
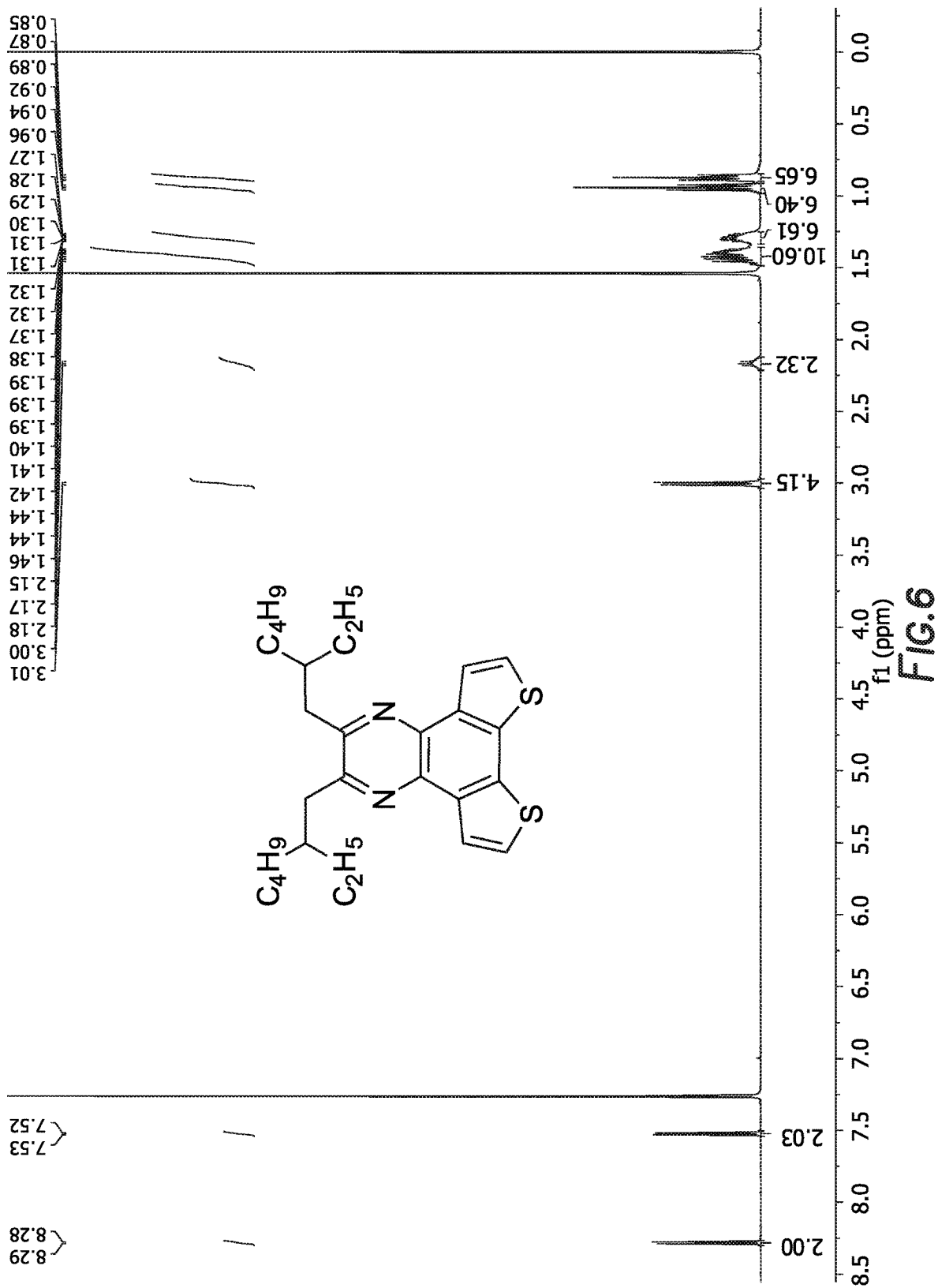
FIG. 6 depicts the $^1$H NMR spectrum of compound 4.

The formation of compound 4 is formed by combining compound 3 (1.6 g, 7.262 mmol) and compound 1 (2.154 g, 7.625 mmol) in a 50 mL Schlenk flask. The flask was evacuated and refilled with argon, then acetic acid was added, and the reaction was heated to 100° C. for 16 h. The reaction mixture was cooled to room temperature, then diluted with water and transferred to a separatory funnel. The aqueous layer was extracted with dichloromethane. The aqueous layer was neutralized with Na$_2$CO$_3$ and extracted with dichloromethane. The combined organic extracts were dried (MgSO$_4$), filtered, and concentrated. The crude material was dissolved in dichloromethane, adsorbed onto silica gel and purified on a 100 g Biotage cartridge with a 0-60% dichloromethane/hexanes gradient. Fractions containing the desired product were concentrated to afford a yellow solid (1.55 g, 46% yield). The $^1$H NMR spectrum of compound 4 is shown in FIG. 6.

Figure 7:
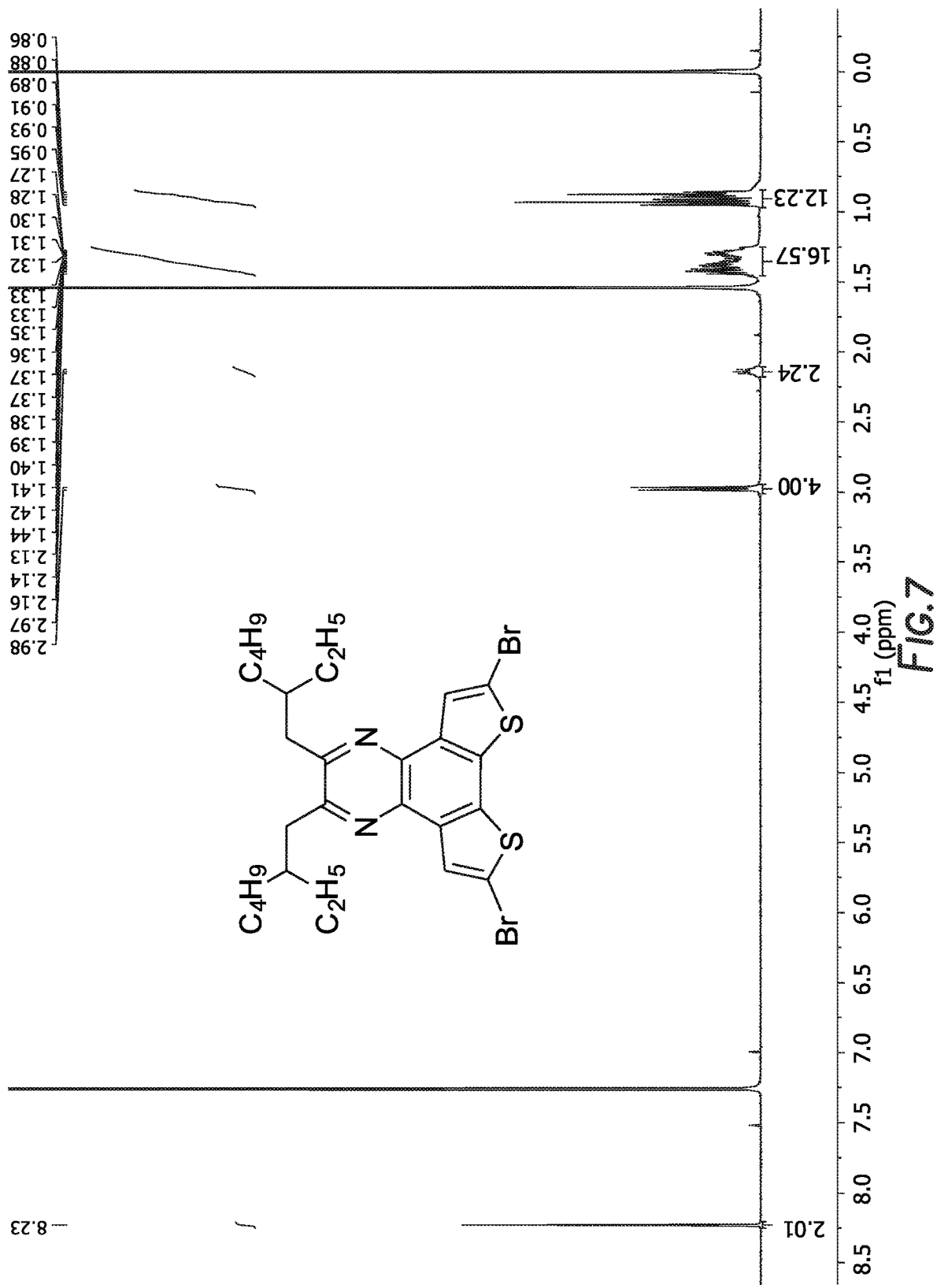
FIG. 7 depicts the $^1$H NMR spectrum of QDT-Br.

The formation of QDT-Br was formed by dissolving compound 4 (400 mg, 0.857 mmol) was dissolved in tetrahydrofuran (9 mL), then treated with N-bromosuccinimide (0.32 g, 0.002 mol) and stirred at room temperature for 16 h. The reaction mixture was poured into water and extracted with dichloromethane (3×). The combined organic extracts were dried (MgSO$_4$), filtered, and concentrated. The crude material was dissolved in dichloromethane, adsorbed onto silica gel, and purified on a 100 g Biotage column with a 0-50% dichloromethane/hexanes gradient. Fractions from the main peak were concentrated to afford a yellow solid (440 mg, 82% yield). The $^1$H NMR spectrum of QDT-Br is shown in FIG. 7.

Figure 8:
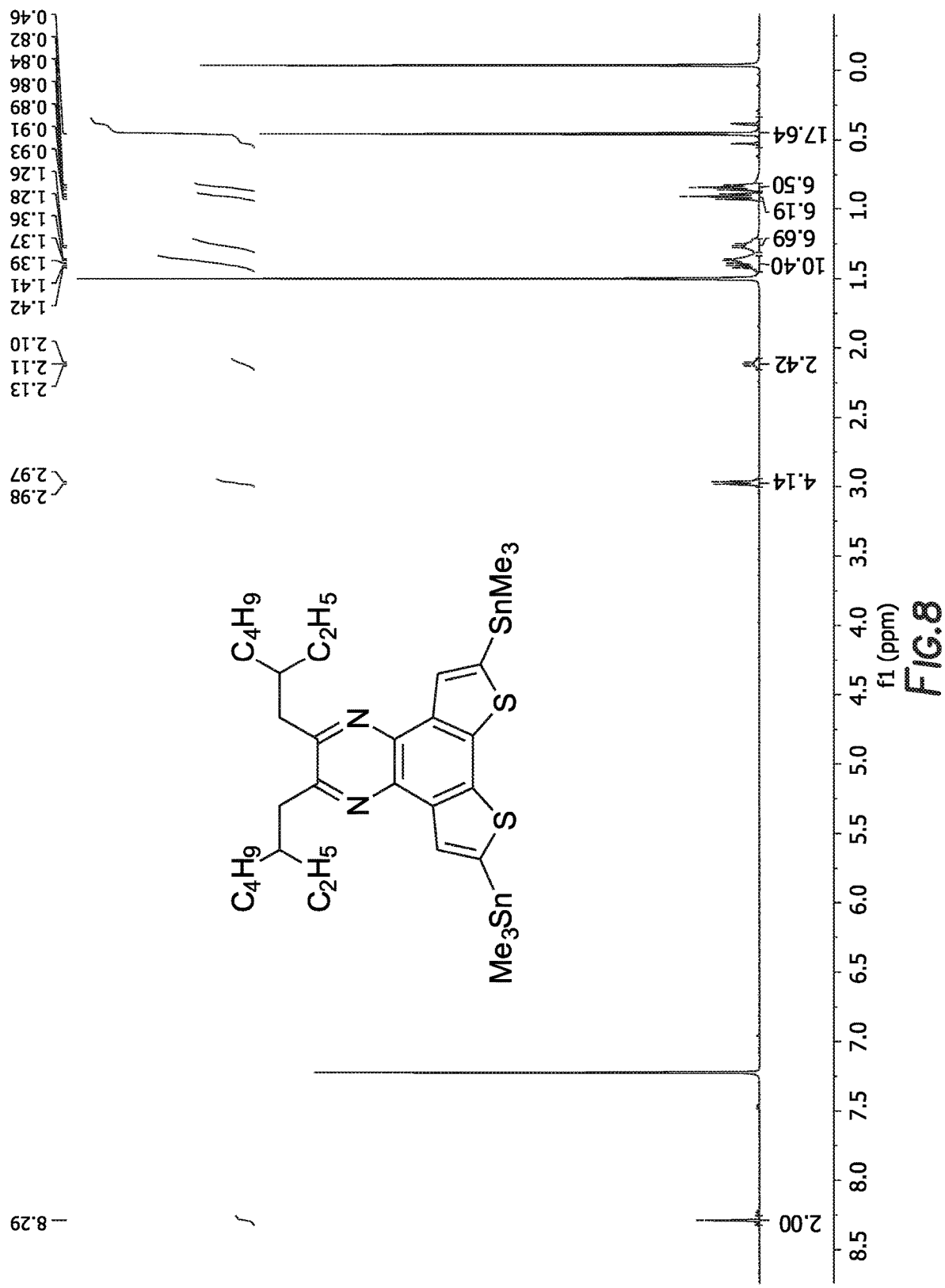
FIG. 8 depicts the $^1$H NMR spectrum of QDT-SnMe$_3$.

The formation of QDT-SnMe$_3$ was formed by combining in an argon-filled Schlenk flask, compound 4 (1.15 g, 2.464 mmol) and dry tetrahydrofuran (25 mL). The solution was cooled to −78° C., then treated dropwise with a solution of n-BuLi (2.5 M in hexanes, 2.4 mL, 5.913 mmol). The reaction was stirred at −78° C. for 1 h, followed by 1.5 h at room temperature. The reaction mixture was again cooled to −78° C. and treated slowly with a SnMe$_3$Cl solution (1 M in hexanes, 7.392 mL, 7.392 mol). The reaction gradually warmed to room temperature and was stirred for 16 h. The reaction mixture was poured into water and extracted with dichloromethane (3×). The combined organic extracts were washed with water, dried (MgSO$_4$), and filtered, and concentrated to afford a yellow oil. Recrystallization was attempted from isopropanol, methanol, and ethanol, but the material always oiled out. The resulting greenish oil (850 mg, 44% yield) was used without further purification. The $^1$H NMR spectrum of QDT-SnMe$_3$ is shown in FIG. 8.

Repeat Unit B:

In one embodiment repeat unit B are asymmetrical bithiophene monomers

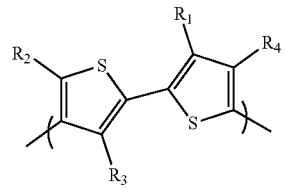

or benzodithiophene

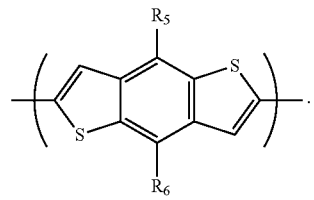

In repeat unit B, R$_1$, R$_2$, R$_3$, R$_4$, R$_5$ and R$_6$ are independently selected from the group consisting of, Cl, F, CN, alkyl, alkoxy, alkylthio, ester, ketone and aryl groups.

Figure 9:
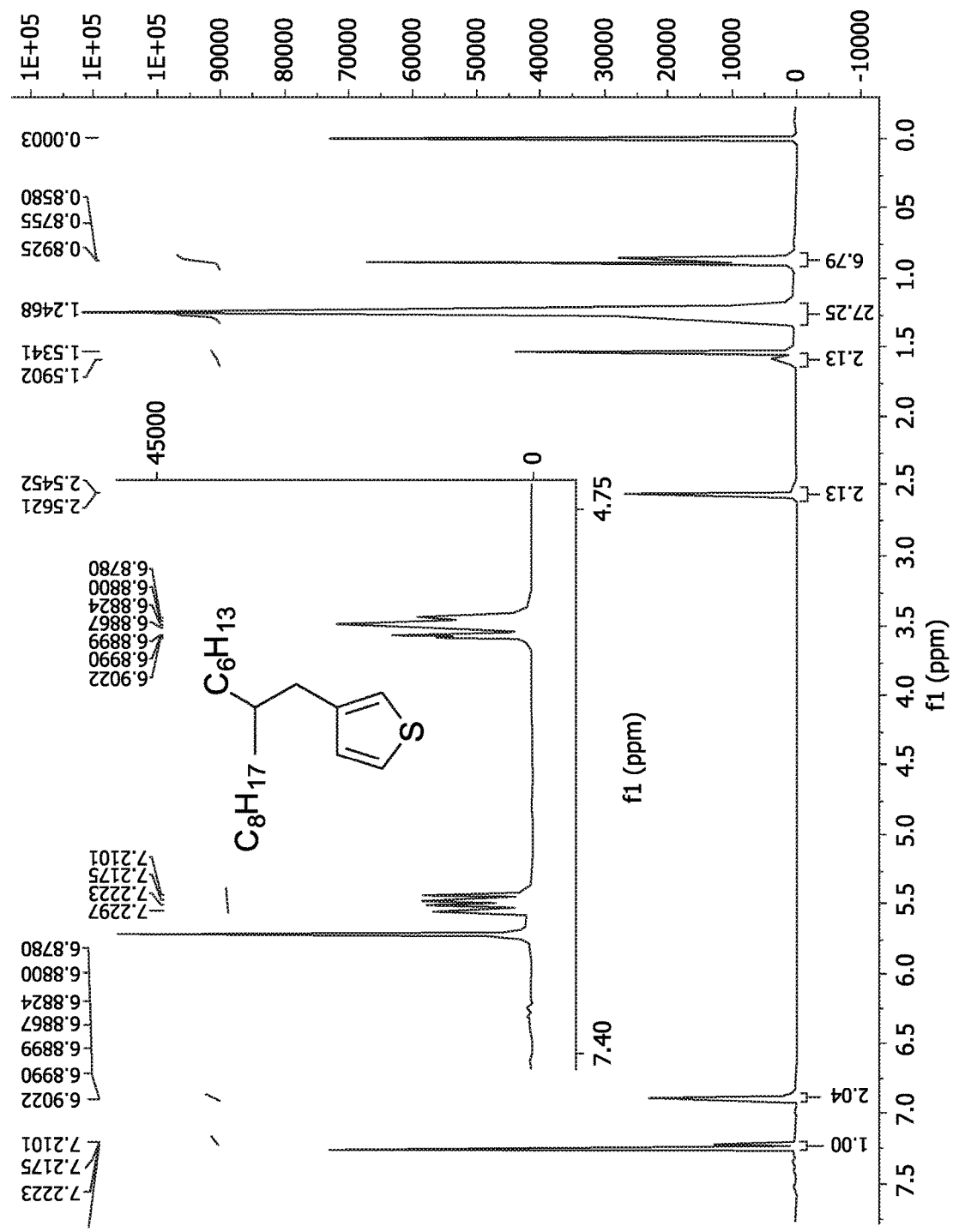
FIG. 9 depicts the NMR spectrum of the first step of forming an asymmetrical bithiophene monomer.

In a non-limiting example, the formation of the asymmetrical bithiophene monomer are is described below. The formation of the asymmetrical bithiophene monomer can begin with the synthesis of 3-(2-hexyldecyl)thiophene. In a three-neck 500 mL flask magnesium turnings (3.184 g, 0.131 mol) were added. 7-(Bromomethyl)pentadecane (20 g, 0.066 mol) was added into an addition funnel. The system was vacuumed and backfilled with argon three times. A small amount of iodine was added before 10 mL of anhydrous THF was added to flask and 90 mL of anhydrous THF was added into the addition funnel. The reaction was initiated by heating to refluxing after the first 10 mL of 7-(bromomethyl)pentadecane solution was added. After refluxing for 2 h, it was cooled down to room temperature. In another 100 mL Schlenk flask, 3-bromothiophene (10.68 g, 0.066 mol) and Ni(dppp)$_{Cl2}$ (1.78 g, 3.3 mmol) was solubilized in 100 mL of anhydrous THF and then transferred into the reaction mixture slowly. The reaction mixture was further refluxed 70° C. for 3 hours before stirred at room temperature overnight. The reaction was quenched by pouring onto crushed ice. A cold HCl aq. solution was added to dissolve the solid. The product was extracted with hexane and dried over anhydrous MgSO$_4$. The crude product was purified by column chromatography using hexane as the eluent, and then by vacuum distillation, to give a clear colorless liquid as product (6.80 g, 33.6%). The NMR spectrum is shown in FIG. 9.

Figure 10:
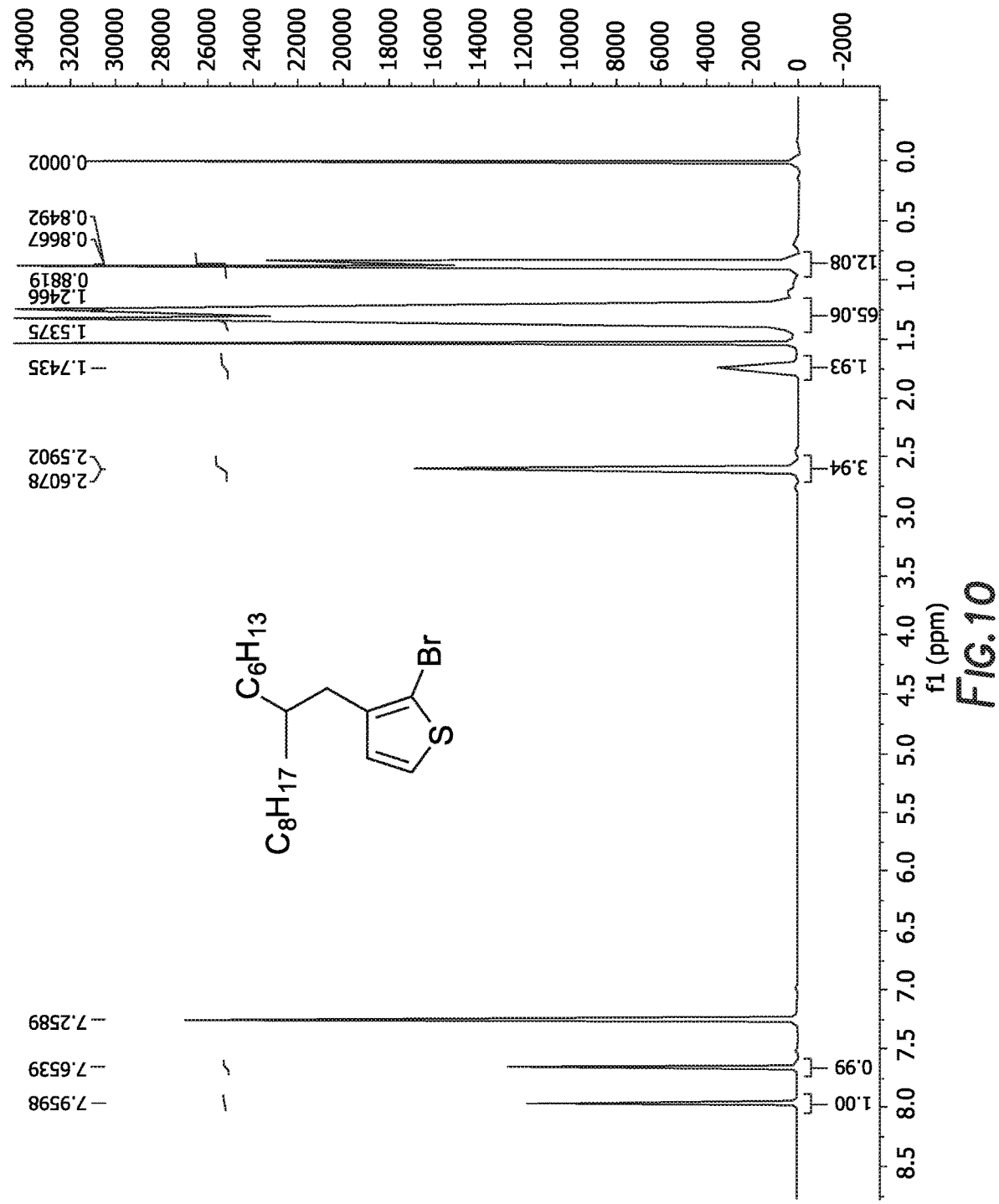
FIG. 10 depicts the NMR spectrum of the second step of forming an asymmetrical bithiophene monomer.

The second step of the formation of the asymmetrical bithiophene monomer can begin with the synthesis of 2-bromo-3-(2-hexyldecyl)thiophene. 3-(2-Hexyldecyl)thiophene (5 g, 0.016 mol) was added to a 200 mL Schlenk flask. The system was vacuumed and backfilled with argon three times before 200 mL of anhydrous THF was added. The solution was cooled down to −78° C. before N-bromosuccinimide (2.884 g, 0.016 mol) was added in portions in the absence of light. The reaction mixture was stirred overnight. The reaction was quenched by adding an aqueous solution of $Na_2CO_3$. The product was extracted with hexane and then dried over anhydrous $MgSO_4$ before the removal of solvent. The product was further purified with silica gel column with hexane as eluent and colorless liquid (5.48 g, yield of 87.3%) was obtained after dried in vacuum. The NMR spectrum is shown in FIG. 10.

Figure 11:
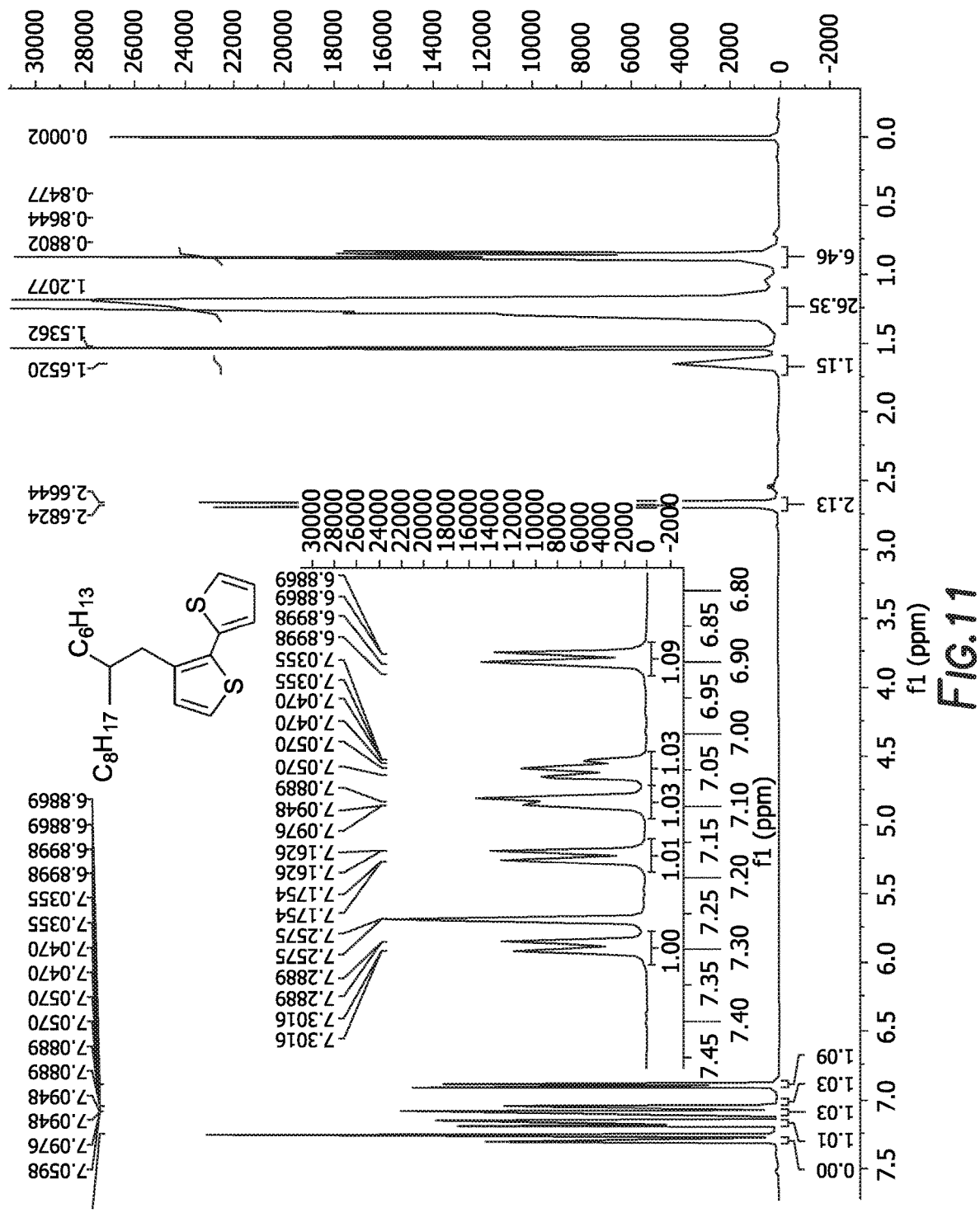
FIG. 11 depicts the NMR spectrum of the third step of forming an asymmetrical bithiophene monomer.

The third step of the formation of the asymmetrical bithiophene monomer can begin with the synthesis of 3-(2-hexyldecyl)-2,2'-bithiophene. 2-Bromo-3-(2-hexyldecyl)thiophene (5.68 g, 0.015 mol), tributyl(thiophen-2-yl)stannane (5.471 g, 0.015 mol) and Pd2(dba)3 (0.268 g, 0.293 mmol), P(o-tol)$_3$ (0.357 g, 1.173 mmol) were combined in 200 mL Schlenk flask. After the system was vacuumed and backfilled with argon three times, 100 mL of anhydrous toluene was injected. The reaction was heated at 105° C. for 24 hours and cooled down to room temperature. The toluene solvent was removed by rotary evaporator and the resulting residue was purified by silica gel column with pure hexane as eluent. Vacuum distillation of the crude offered colorless liquid as the final product (4.34 g, 74.1%). The NMR spectrum is shown in FIG. 11.

Figure 12:
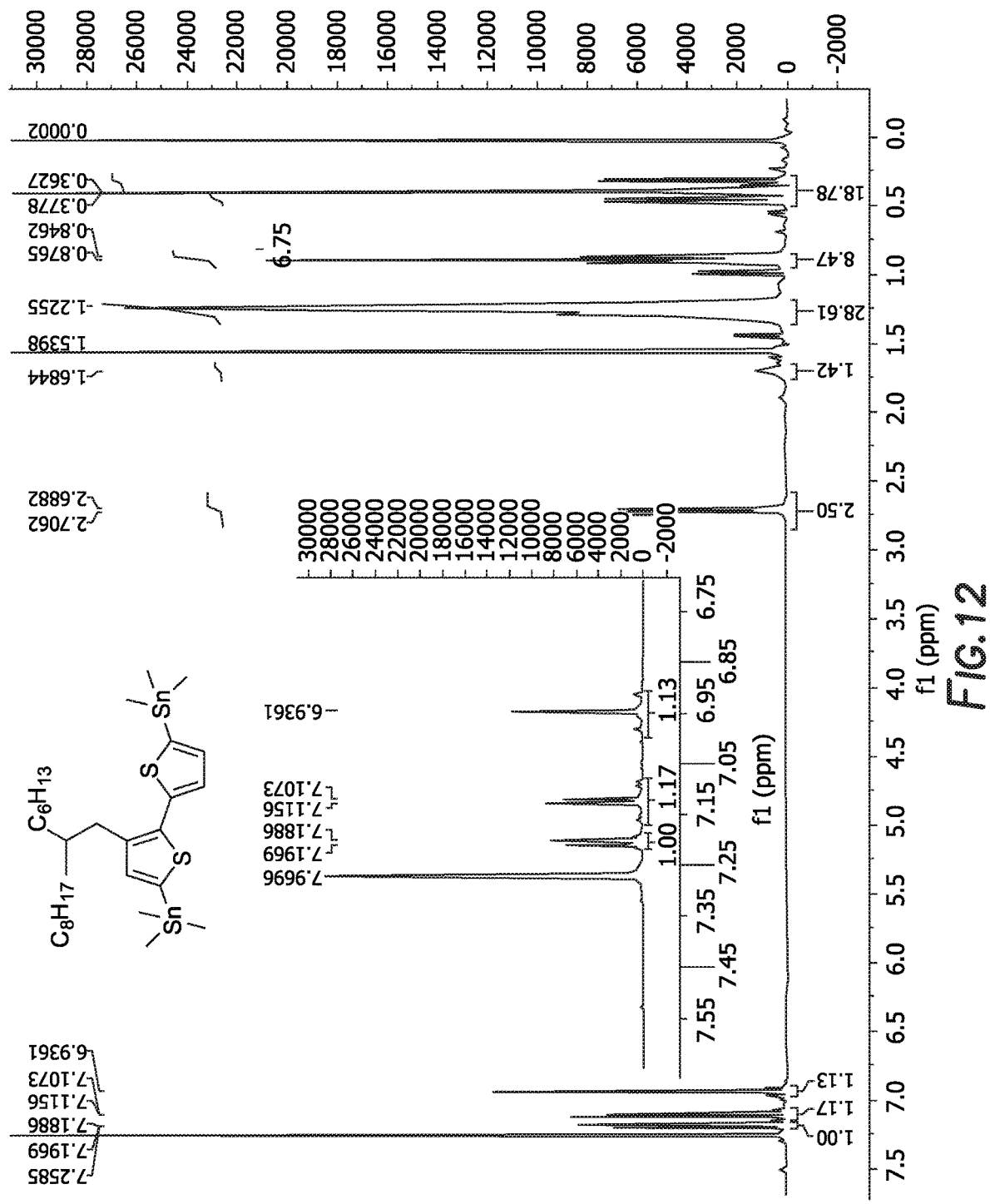
FIG. 12 depicts the NMR spectrum of an asymmetrical bithiophene monomer.

The last step of the formation of the asymmetrical bithiophene monomer can begin with the synthesis of (3-(2-hexyldecyl)-[2,2'-bithiophene]-5,5'-diyl)bis(trimethylstannane)(HDTT). 3-(2-Hexyldecyl)-2-(thiophen-2-yl) thiophene (4.15 g, 10.6 mmol) was added to a 200 mL Schlenk flask. The system was vacuumed and backfilled with argon three times before 100 mL of anhydrous THF was added. The solution was cooled down to −78° C. before n-butyl lithium (9.35 mL, 2.5 M in THF, 23.4 mmol) was added dropwise. The reaction was stirred at room temperature for 1.5 hour before cooled down to −78° C. again. Trimethyltin chloride (26.56 mL, 1.0 M in THF, 26.556 mmol) solution was added drop-wise. The resulting mixture was stirred overnight. 50 mL of water was added. The product was extracted with hexane. The organic layers were washed with water three times before dried over anhydrous $Na_2SO_4$. The solvent was removed and then dissolved with hexane and washed with methanol twice. Green liquid (5.05 g, yield 66.4%) was obtained as product after the removal of solvent. The NMR spectrum is shown in FIG. 12.

Figure 13:
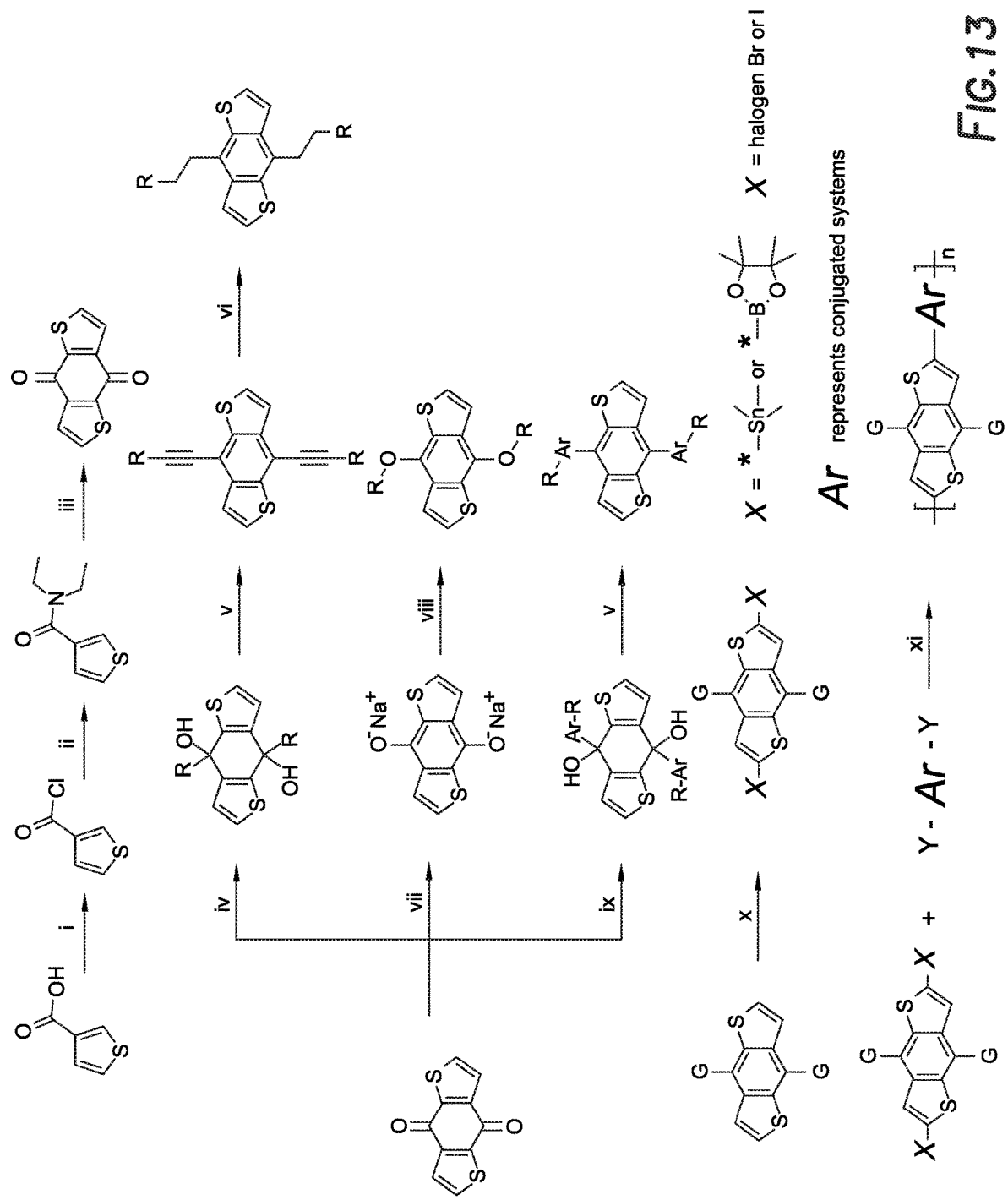
FIG. 13 depicts different methods of forming benzodithiophene.

In a non-limiting example FIG. 13 depicts different methods of forming benzodithiophene. While conventional methods are shown in FIG. 13, the invention is not limited to any one specific method of forming benzodithiophene. In FIG. 13, (i) Oxalyl Chloride; (ii) Diethylamine; (iii) n-Butyllithium then water; (iv) Alkyne Lithium; (v) $SnCl_2$, HCl; (vi) Pd/C, H2; (vii) Zn, NaOH, $H_2O$; (viii) Bromoalkane, TBAB; (ix) Aromatic Lithium; (x) n-Butyllithium, Chlorotrimethylstannane or 2-Isopropoxy-4,4,5,5-tetramethyl-1,3,2-dioxaborolane; and (xi) PdCatalyst.

Optional Repeat Unit D:

In one embodiment, at least one optional repeat unit D refers to an optionally substituted, mono-, di-, tri-, or other multicyclic aromatic ring system having from about 5 to about 50 carbon atoms (and all combinations and subcombinations of ranges and specific numbers of carbon atoms therein), with from about 6 to about 20 carbons being preferred. Non-limiting examples include, for example, phenyl, naphthyl, anthracenyl, and phenanthrenyl. Aryl groups can be optionally substituted with one or with one or more Rx. In this application aryl groups can include the possibility of substituted aryl groups, bridged aryl groups and fused aryl groups. While it is feasible that there is only one repeat unit D in the copolymer, it is also envisioned that multiple repeat unit D's can exist within the copolymer.

In one embodiment the aryl group can consist of:

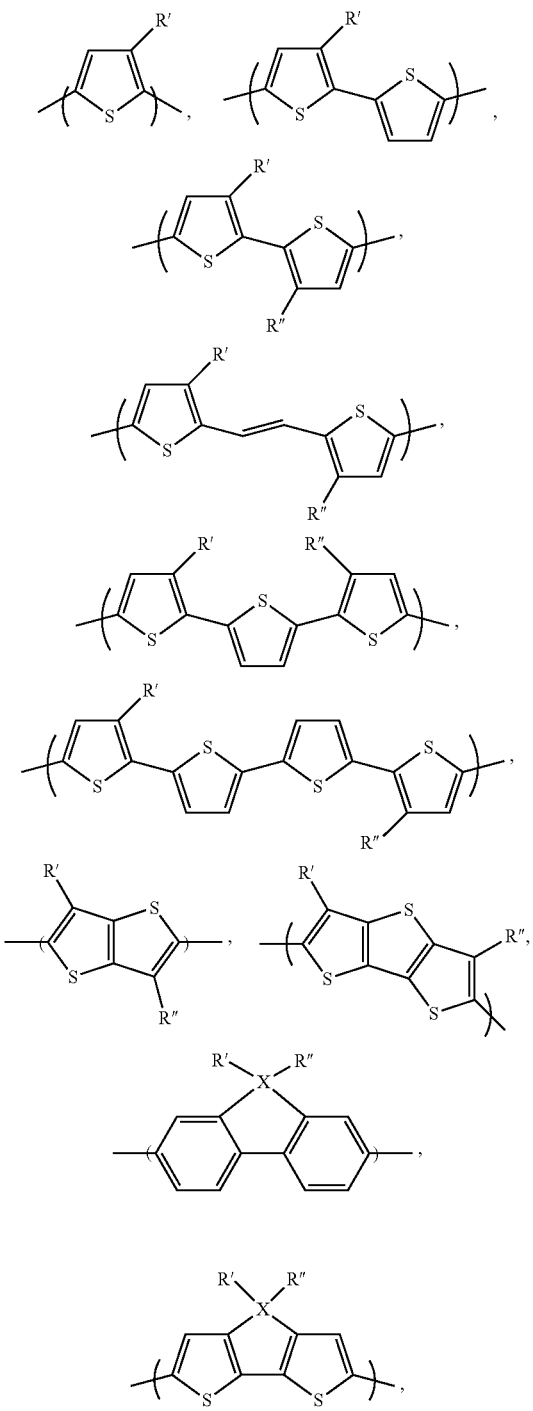

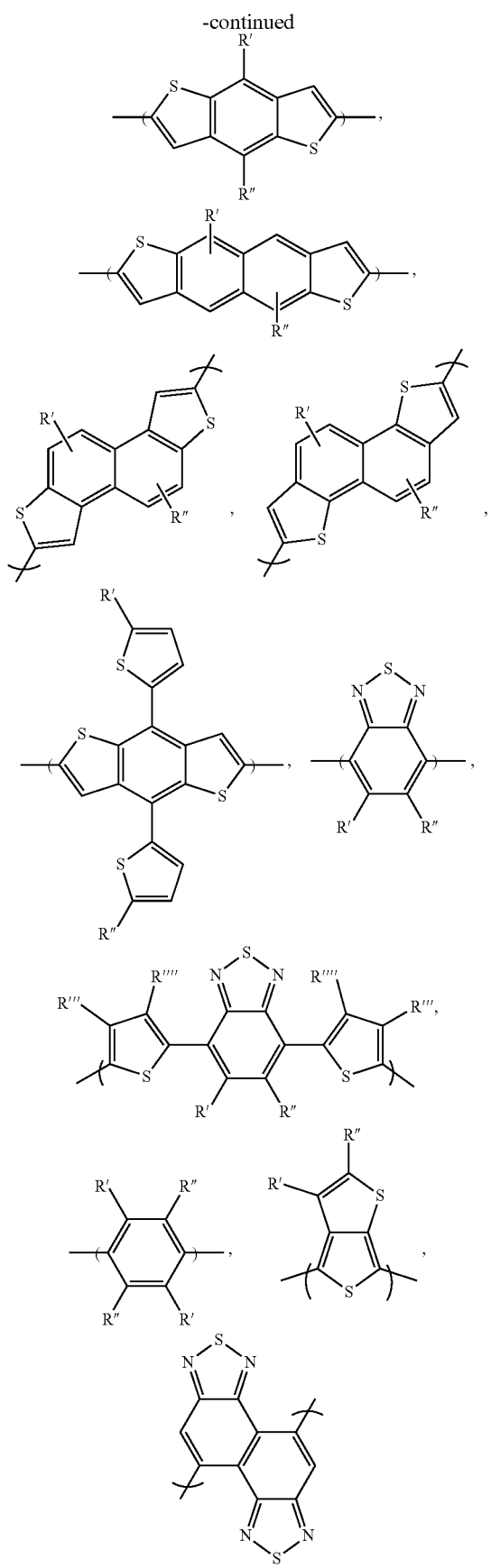

and combinations thereof, wherein R', R", R'" and R"" are independently selected from the group consisting of: H, Cl, F, CN, alkyl, alkoxy, alkylthio, ester, ketone and aryl groups. In another embodiment, the aryl group is a 3,3'difluror-2, 2'-bithiophene.

Copolymer

When combined, repeat unit A, repeat unit B and optional repeat unit D produce a copolymer. The copolymer can be regio-random or regio-regular. It is envisioned that the copolymer can be used as a photovoltaic material. It is also envisioned that the copolymer can be used in the active layer in an electronic device. In one embodiment the number of repeat units A, B and C can range from about 3 to about 10,000 in the copolymer. In an alternate embodiment, the copolymer can form a polymer bandgap greater than 1.8 eV.

In some embodiments, the copolymer can contain a combination of repeat units A and B as repeat unit E:

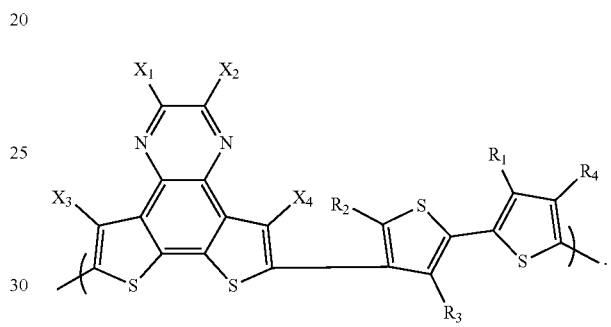

In an alternate embodiment, the copolymer can contain a combination of repeat units A and B as repeat unit F:

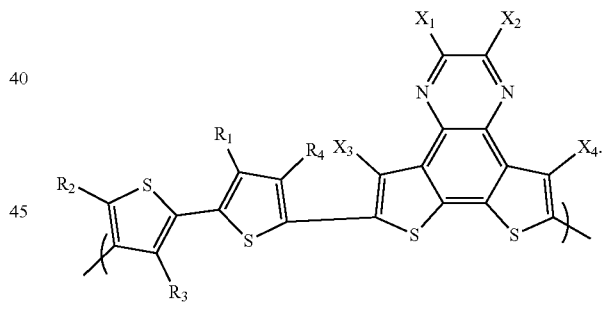

In some embodiments, the copolymer can contain a combination of repeat units A and D as repeat unit G:

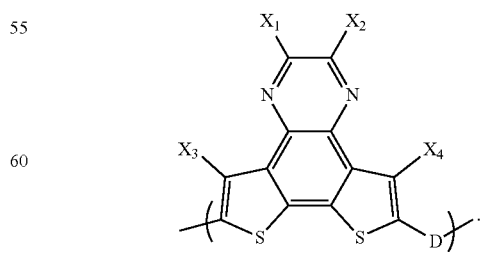

In an alternate embodiment, the copolymer can contain a combination of repeat units A and D as repeat unit H:

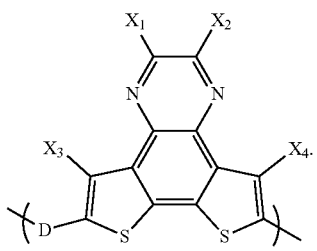

In one embodiment, the amount of repeat unit A in the copolymer can range from 1 wt % to 99 wt %.

In one embodiment, the amount of repeat unit B in the copolymer can range from 1 wt % to 99 wt %.

In one embodiment, the amount of repeat unit D in the copolymer can range from 0 wt % to 99 wt. %.

Anode

When used in an organic photovoltaic device the copolymer can be used in conjunction with an anode. The anode for the organic photovoltaic device can be any conventionally known anode capable of operating as an organic photovoltaic device. Examples of anodes that can be used include: indium tin oxide, aluminum, carbon, graphite, graphene, PEDOT:PSS, copper, metal nanowires, $Zn_{99}InO_x$, $Zn_{98}In_2O_x$, $Zn_{97}In_3O_x$, $Zn_{95}Mg_5O_x$, $Zn_{90}Mg_{10}O_x$, and $Zn_{85}Mg_{15}O_x$.

Cathode

When used in an organic photovoltaic device the copolymer can be used in conjunction with a cathode. The cathode for the organic photovoltaic device can be any conventionally known cathode capable of operating as an organic photovoltaic device. Examples of cathodes that can be used include: indium tin oxide, carbon, graphite, graphene, PEDOT:PSS, copper, silver, gold, metal nanowires.

Electron Transport Layer

When used in an organic photovoltaic device the copolymer can be deposited onto an electron transport layer. Any commercially available electron transport layer can be used that is optimized for organic photovoltaic devices. In one embodiment, the electron transport layer can comprise $(AO_x)_yBO_{(1-y)}$. In this embodiment, $(AO_x)_y$ and $BO_{(1-y)}$ are metal oxides. A and B can be different metals selected to achieve ideal electron transport layers. In one embodiment A can be aluminum, indium, zinc, tin, copper, nickel, cobalt, iron, ruthenium, rhodium, osmium, tungsten, magnesium, indium, vanadium, titanium and molybdenum.

In one embodiment B can be aluminum, indium, zinc, tin, copper, nickel, cobalt, iron, ruthenium, rhodium, osmium, tungsten, vanadium, titanium and molybdenum.

Examples of $(AO_x)_yBO_{(1-y)}$ include: $(SnO_x)_yZnO_{(1-y)}$, $(AlO_x)_yZnO_{(1-y)}$, $(AlO_x)_yInO_{z(1-y)}$, $(AlO_x)_ySnO_{z(1-y)}$, $(AlO_x)_yCuO_{z(1-y)}$, $(AlO_x W O_{z(1-y)}$, $(InO_x)_yZnO_{(1-y)}$, $(InO_x)_ySnO_{z(1-y)}$, $(InO_x)_yNiO_{z(1-y)}$, $(ZnO_x)_yCuO_{z(1-y)}$, $(ZnO_x)_yNiO_{z(1-y)}$, $(ZnO_x)_yFeO_{z(1-y)}$, $(WO_x)_yVO_{z(1-y)}$, $(WO_x)_yTiO_{z(1-y)}$, and $(WO_x)_yMoO_{z(1-y)}$.

In an alternate embodiment, various fullerene dopants can be combined with $(AO_x)_yBO_{(1-y)}$ to make an electron transport layer for the organic photovoltaic device. Examples of fullerene dopants that can be combined include

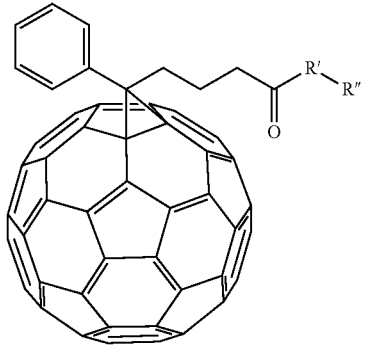

and [6,6]-phenyl-$C_{60}$-butyric-N-2-trimethylammonium ethyl ester iodide.

In the embodiment of

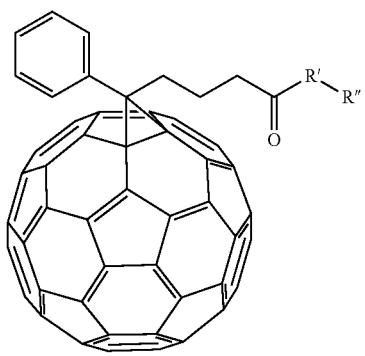

R' can be selected from either N, O, S, C, or B. In other embodiment R" can be alkyl chains or substituted alkyl chains. Examples of substitutions for the substituted alkyl chains include halogens, N, Br, O, Si, or S. In one example R" can be selected from

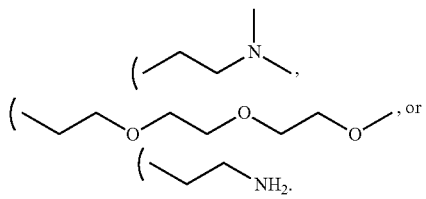

Other examples of fullerene dopants that can be used include: [6,6]-phenyl-$C_{60}$-butyric-N-(2-aminoethyl)acetamide, [6,6]-phenyl-$C_{60}$-butyric-N-triethyleneglycol ester and [6,6]-phenyl-$C_{60}$-butyric-N-2-dimethylaminoethyl ester.

Synthesis of Polymers

Sample A:

In a Schlenk flask, QDT-Br (53.53 mg, 0.086 mmol), (3-(2-hexyldecyl)-[2,2'-bithiophene]-5,5'-diyl)bis(trimethylstannane) (61.40 mg, 0.086 mmol), P(o-tol)$_3$ (4.17 mg, 0.014 mmol), and Pd$_2$dba$_3$ (3.14 mg, 0.003 mmol) were combined, then degassed for 2 h. After refilling with argon, dry chlorobenzene (1.7 mL) was added, and the reaction mixture was degassed via three freeze-pump-thaw cycles, using liquid nitrogen to freeze the solution. The solution was then heated to 125° C. and stirred for 21 h under argon atmosphere. The reaction mixture was cooled to room temperature, poured into methanol (50 mL), and the polymer was collected by filtration. The polymer was purified by Soxhlet extraction, washing sequentially with acetone and hexanes. The polymer, Sample A, was recovered in the hexanes fraction (62 mg, 82% yield).

mixture was degassed via three freeze-pump-thaw cycles, using liquid nitrogen to freeze the solution. The solution was then heated to 125° C. and stirred for 23 h under argon atmosphere. The reaction mixture was cooled to room temperature, poured into methanol (50 mL), and the polymer was collected by filtration. The polymer was purified by

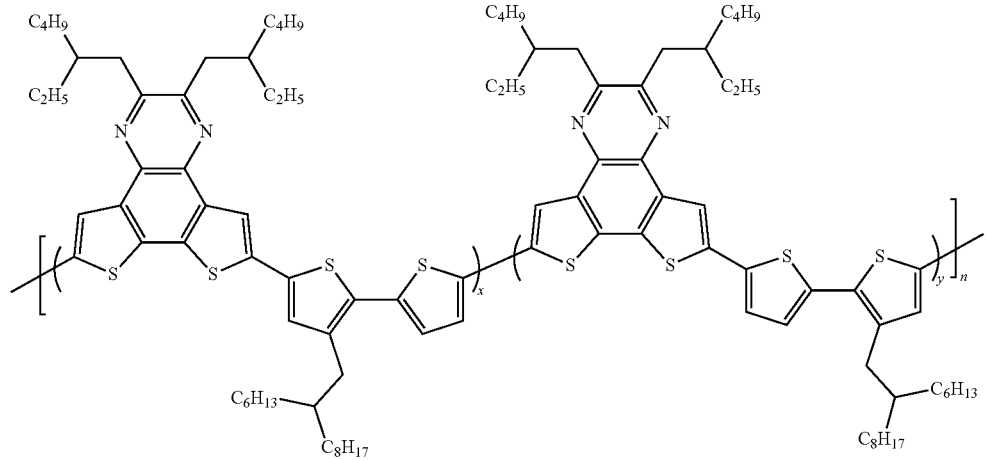

Sample B:
In a Schlenk flask, QDT-Br (55.42 mg, 0.089 mmol), stannane, 1,1'-[3, 3'''-bis(2-octyldodecyl)[2,2':5',2'':5'',2'''-quaterthiophene]-5,5'''-diyl]bis[1,1,1-trimethyl (108.00 mg, 0.089 mmol), P(o-tol)$_3$ (4.32 mg, 0.014 mmol), and Pd$_2$dba$_3$ (3.25 mg, 0.003 mmol) were combined, then degassed for 2 h. After refilling with argon, dry chlorobenzene (1.8 mL) was added, and the reaction mixture was degassed via three freeze-pump-thaw cycles, using liquid nitrogen to freeze the solution. The solution was then heated to 125° C. and stirred for 21 h under argon atmosphere. The reaction mixture was cooled to room temperature, poured into methanol (50 mL), and the polymer was collected by filtration. The polymer was purified by Soxhlet extraction, washing sequentially with acetone and hexanes. The polymer, Sample B, was recovered in the hexanes fraction (89 mg, 72% yield).

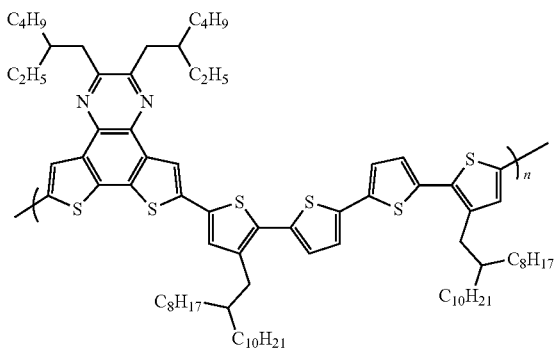

Sample C:
In a Schlenk flask, QDT-Br (50.00 mg, 0.080 mmol), Stannane, 1,1'-naphtho[1,2-b:5,6-b']dithiophene-2,7-diylbis[1,1,1-trimethyl (45.31 mg, 0.080 mmol), P(o-tol)$_3$ (3.90 mg, 0.013 mmol), and Pd$_2$dba$_3$ (2.93 mg, 0.003 mmol) were combined, then degassed for 2 h. After refilling with argon, dry chlorobenzene (1.6 mL) was added, and the reaction Soxhlet extraction, washing sequentially with acetone, hexanes, and chloroform. The polymer, Sample C, was recovered in the chloroform fraction (22 mg, 37% yield).

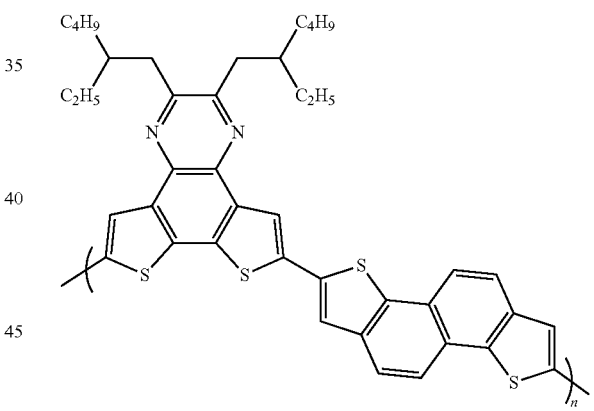

Sample D:
In a Schlenk flask, QDT-SnMe$_3$ (40.00 mg, 0.050 mmol), 2,1,3-Benzothiadiazole, 4,7-bis[5-bromo-4-(2-octyldodecyl)-2-thienyl]-5,6-difluoro (45.31 mg, 0.080 mmol), P(o-tol)$_3$ (2.46 mg, 0.008 mmol), and Pd$_2$dba$_3$ (1.85 mg, 0.002 mmol) were combined, then degassed for 2 h. After refilling with argon, dry chlorobenzene (1.0 mL) was added, and the reaction mixture was degassed via three freeze-pump-thaw cycles, using liquid nitrogen to freeze the solution. The solution was then heated to 125° C. and stirred for 23 h under argon atmosphere. The reaction mixture was cooled to room temperature, poured into methanol (50 mL), and the polymer was collected by filtration. The polymer was purified by Soxhlet extraction, washing sequentially with acetone and hexanes. The polymer, Sample D, was recovered in the hexanes fraction (55 mg, 78% yield).

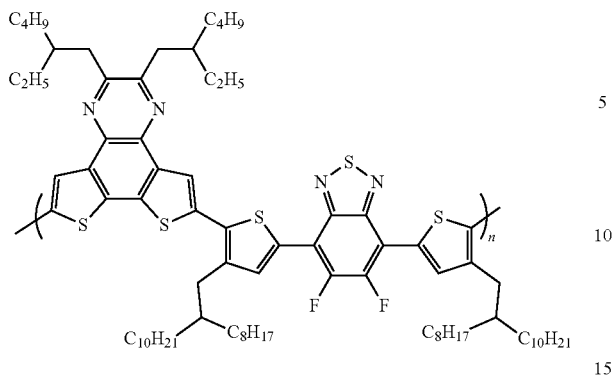

Sample E:

In a Schlenk flask, QDT-Br (100.3 mg, 0.161 mmol), (3-(2-hexyldecyl)-[2,2'-bithiophene]-5,5'-diyl)bis(trimethylstannane) (57.5 mg, 0.08 mmol), Stannane, 1,1'-[4,8-bis[5-(2-ethylhexyl)-2-thienyl]benzo[1,2-b:4,5-b']dithiophene-2,6-diyl]bis[1,1,1-trimethyl (72.6 mg, 0.08 mmol), P(o-tol)$_3$ (7.8 mg, 0.026 mmol), and Pd$_2$dba$_3$ (5.9 mg, 0.006 mmol) were combined, then degassed for 1 h. After refilling with argon, dry chlorobenzene (3.2 mL) was added, and the reaction mixture was degassed via three freeze-pump-thaw cycles, using liquid nitrogen to freeze the solution. The solution was then heated to 130° C. and stirred for 24 h under argon atmosphere. The reaction mixture was cooled to room temperature, poured into methanol (50 mL), and the polymer was collected by filtration. The polymer was purified by Soxhlet extraction, washing sequentially with acetone, hexanes, and chloroform. The polymer, Sample E, was recovered in the chloroform fraction (130 mg, 85% yield).

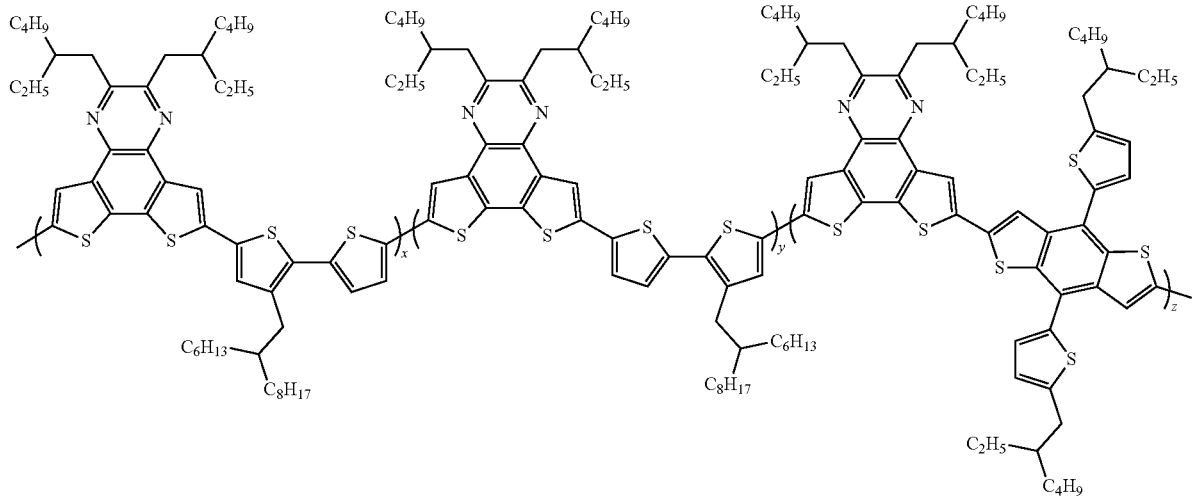

Sample F:

In a Schlenk flask, QDT-Br (100.1 mg, 0.160 mmol), (3-(2-hexyldecyl)-[2,2'-bithiophene]-5,5'-diyl)bis(trimethylstannane) (80.4 mg, 0.11 mmol), Stannane, 1,1'-(3,3'-difluoro[2,2'-bithiophene]-5,5'-diyl)bis[1,1,1-trimethyl (25.4 mg, 0.05 mmol), P(o-tol)$_3$ (7.8 mg, 0.026 mmol), and Pd$_2$dba$_3$ (5.9 mg, 0.006 mmol) were combined, then degassed for 1 h. After refilling with argon, dry chlorobenzene (3.2 mL) was added, and the reaction mixture was degassed via three freeze-pump-thaw cycles, using liquid nitrogen to freeze the solution. The solution was then heated to 130° C. and stirred for 24 h under argon atmosphere. The reaction mixture was cooled to room temperature, poured into methanol (50 mL), and the polymer was collected by filtration. The polymer was purified by Soxhlet extraction, washing sequentially with acetone, hexanes, and chloroform. The polymer, Sample F, was recovered in the chloroform fraction (100 mg, 99% yield).

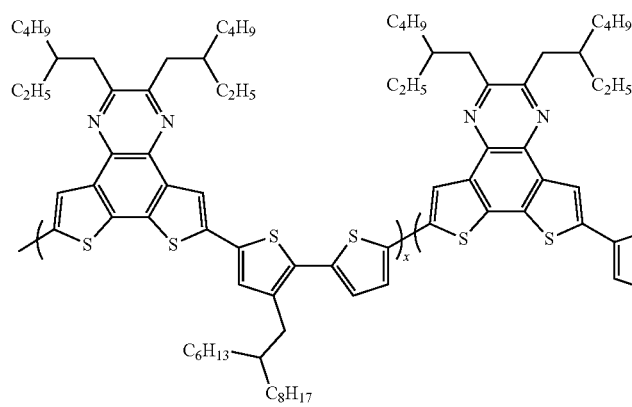
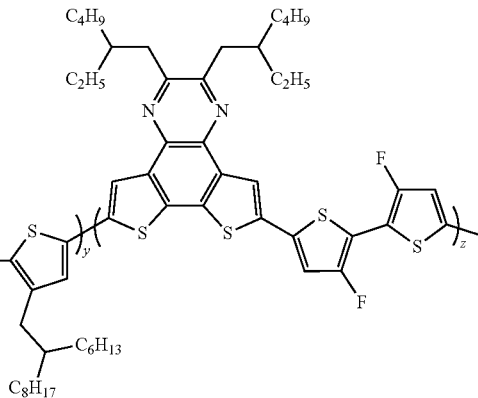

Organic Photovoltaic Device Fabrication

Zinc/tin oxide (ZTO):phenyl-C60-butyric-N-(2-hydroxyethyl)acetamide (PCBNOH) sol-gel solution was prepared by dissolving zinc acetate dihydrate or tin(II) acetate in 2-methoxyethanol and ethanolamine. Specifically, the ZTO:PCBNOH sol-gel electron transport layer solution was prepared by mixing 3.98 g of $Zn(OAc)_2$, 398 mg of $Sn(OAc)_2$ and 20.0 mg PCBNOH in 54 mL of 2-methoxyethanol with adding 996 μL of ethanolamine. Solutions were then further diluted to 65% by adding more 2-methoxyethanol and stirred for at least an hour before spin casting onto indium tin oxide substrate to form the electron transport layer.

The polymer and the acceptor, $PC_{70}BM$ and a non-fullerene acceptor 3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b']dithiophene (ITIC) in a ratio of 1:1.2 were dissolved in chlorobenzene at the concentration of 26 mg/mL to obtain the photoactive layer solution. The solution was stirred and heated at 80° C. overnight in a nitrogen filled glove box. The next day 3.0 vol % of 1,8-diiodooctane (DIO) was added before spin-coating of the photoactive layer.

Indium tin oxide patterned glass substrates were cleaned by successive ultra-sonications in acetone and isopropanol. Each 15-min step was repeated twice and the freshly cleaned substrates were left to dry overnight at 60° C. Preceding fabrication, the substrates were further cleaned for 1.5 min in a UV-ozone chamber and the electron transport layer was immediately spin coated on top.

Sol-gel electron transport layer solution was filtered directly onto the indium tin oxide with a 0.25 μm poly(vinylidene fluoride) filter and spin cast at 4000 rpm for 40 s. Films were then annealed at 250° C. for 15 min, and directly transferred into a nitrogen filled glove box.

The photoactive layer was deposited on the electron transport layer via spin coating at 600 rpm for 40 s with the solution and the substrate being preheated at 110° C. and directly transferred into a glass petri dish for overnight solvent annealing.

After annealing, the substrates were loaded into the vacuum evaporator where $MoO_3$ (hole transport layer) and Ag (anode) were sequentially deposited by thermal evaporation. Deposition occurred at a pressure of $<4\times10^{-6}$ torr. $MoO_3$ and Ag had thicknesses of 5.0 nm and 120 nm, respectively. Samples were then encapsulated with glass using an epoxy binder and treated with UV light for 3 min.

UV-Visible Absorption Spectroscopy

Figure 14:
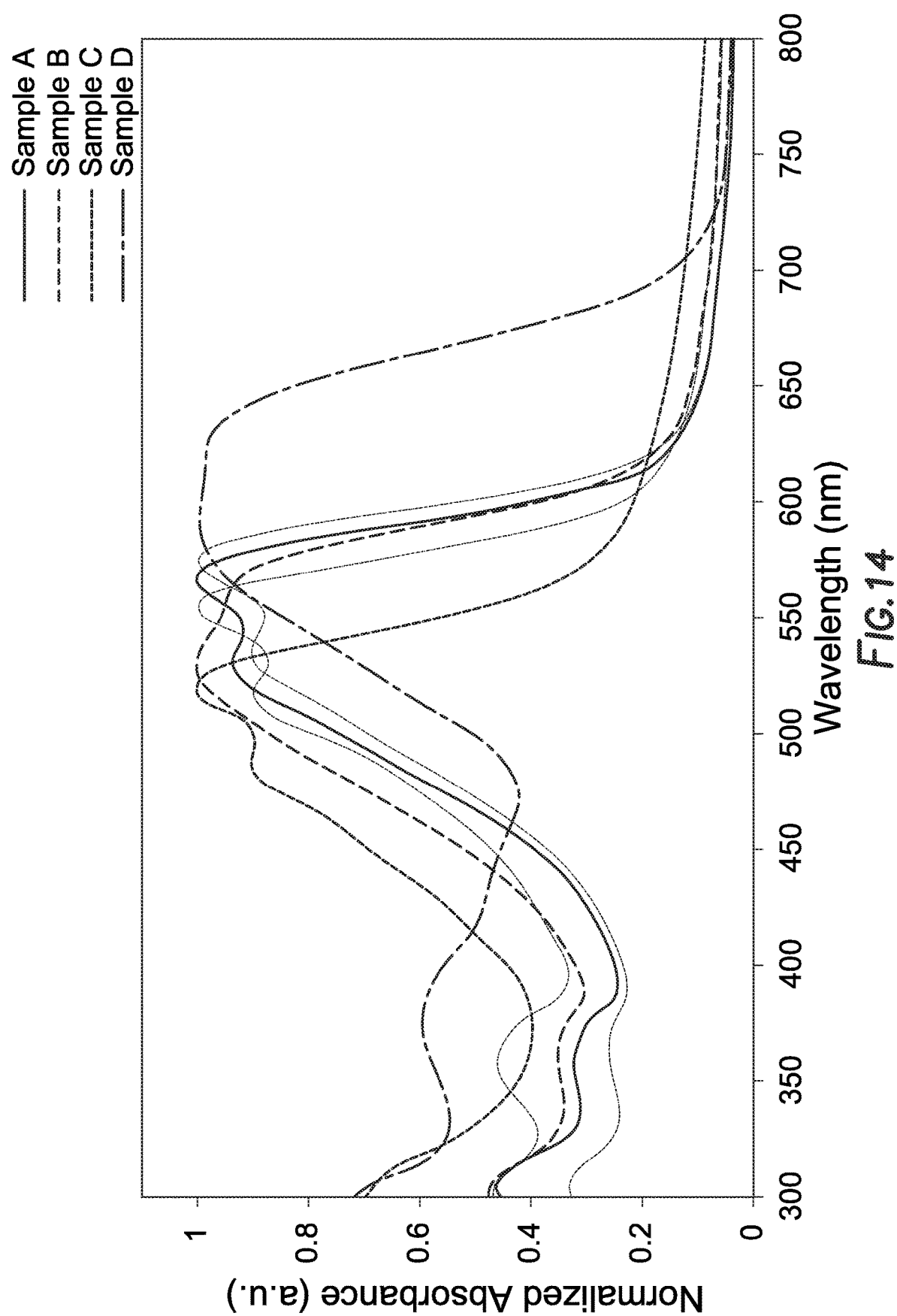
FIG. 14 depicts the UV-Visible absorption of different polymers.

Absorption spectroscopy was performed and measured in the wavelength region from 300 to 1000 nm. A blank glass slide background was subtracted from all spectra. The polymer thin film samples were prepared by spin casting a 10 mg/mL solution of polymer (in 50:50 chlorobenzene:dichlorobenzene) onto a glass slide at 1200 rpm. FIG. 14 depicts the UV-Visible absorption spectra of the polymers.

Representative Current Density

Representative current density—voltage characteristics are shown below in table 1.

TABLE 1

| Sample with PCBM | Jsc (mA/cm$^2$) | | $V_{oc}$ (V) | | FF (%) | | PCE (%) | | Rs (Ω cm$^2$) | | Rsh (Ω cm$^2$) | |
|---|---|---|---|---|---|---|---|---|---|---|---|---|
| | Avg | Max | Avg | Max | Avg | Max | Avg | Max | Avg | Max | Avg | Max |
| A | 9.82 | 11.4 | 0.76 | 0.78 | 72.0 | 73.2 | 5.4 | 6.01 | 7.34 | 8.01 | 3280 | 5630 |
| B | 4.45 | 4.55 | 0.69 | 0.80 | 45.2 | 49.2 | 1.38 | 1.69 | 52.6 | 70.5 | 858 | 1300 |
| C | 3.19 | 3.65 | 0.56 | 0.63 | 35.8 | 41.7 | 0.63 | 0.69 | 89.4 | 131 | 352 | 388 |
| D | 1.99 | 2.24 | 0.84 | 0.88 | 36.1 | 41.6 | 0.60 | 0.72 | 165 | 201 | 916 | 1250 |
| E | 12.2 | 13 | 0.82 | 0.83 | 65.8 | 67.8 | 6.60 | 6.79 | 6.12 | 7.98 | 2013 | 2586 |
| F | 13.23 | 13.66 | 0.70 | 0.71 | 57.6 | 58.9 | 5.36 | 5.59 | 5.30 | 8.23 | 640.3 | 996.9 |

TABLE 2

| Sample with ITIC | Jsc (mA/cm$^2$) | | $V_{oc}$ (V) | | FF (%) | | PCE (%) | | Rs (Ω cm$^2$) | | Rsh (Ω cm$^2$) | |
|---|---|---|---|---|---|---|---|---|---|---|---|---|
| | Avg | Max | Avg | Max | Avg | Max | Avg | Max | Avg | Max | Avg | Max |
| A | 11.36 | 13.05 | 0.935 | 0.943 | 64.2 | 65.8 | 6.79 | 7.41 | 6.89 | 7.57 | 961 | 1099 |
| E | 13.85 | 14.66 | 0.934 | 0.937 | 61.1 | 62.8 | 7.90 | 8.47 | 8.66 | 9.58 | 1015 | 1269 |

Jsc (mA/cm$^2$) Short-circuit current density (Jsc) is the current density that flows out of the solar cell at zero bias. $V_{oc}$(V) Open-circuit voltage ($V_{oc}$) is the voltage for which the current in the external circuit is zero. FF (%) fill factor (FF) is the ratio of the maximum power point divided by the open circuit voltage and the short circuit current. PCE (%) The power conversion efficiency (PCE) of a photovoltaic cell is the percentage of the solar energy shining on a photovoltaic device that is converted into usable electricity. Rs (Ω cm$^2$) series resistance (Rs) through the photovoltaic cell. Rsh (Ω cm$^2$) parallel resistance though the photovoltaic cell.

In closing, it should be noted that the discussion of any reference is not an admission that it is prior art to the present invention, especially any reference that may have a publication date after the priority date of this application. At the same time, each and every claim below is hereby incorporated into this detailed description or specification as an additional embodiment of the present invention.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

The invention claimed is:

1. A copolymer consisting essentially of:
    an electron accepting repeat unit A, wherein repeat unit A comprises

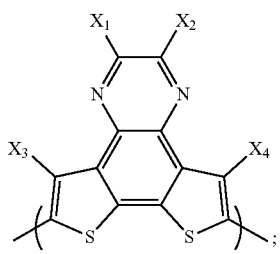

a repeat unit B, wherein repeat unit B comprises

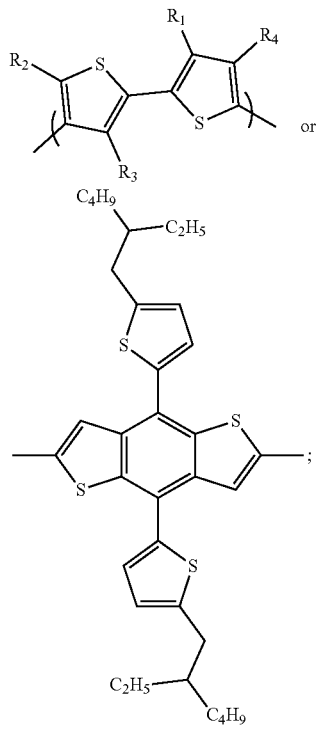

and
at least one optional repeat unit D, wherein repeat unit D comprises an aryl group,
wherein $X_1$, $X_2$, $X_3$, and $X_4$ are independently selected from the group consisting of: H, Cl, F, CN, alkyl, alkoxy, ester, ketone, amide and aryl groups and
$R_1$, $R_2$, $R_3$, and $R_4$, are independently selected from the group consisting of: H, Cl, F, CN, alkyl, alkoxy, alkylthio, ester, ketone and aryl groups.

2. The copolymer of claim 1, wherein the aryl group is selected from the group consisting of:

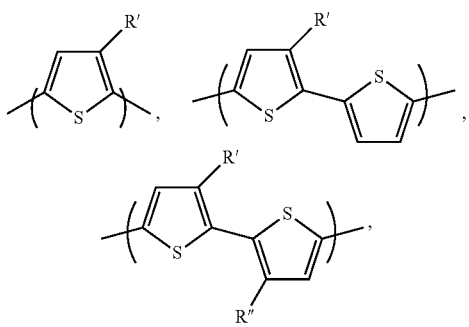

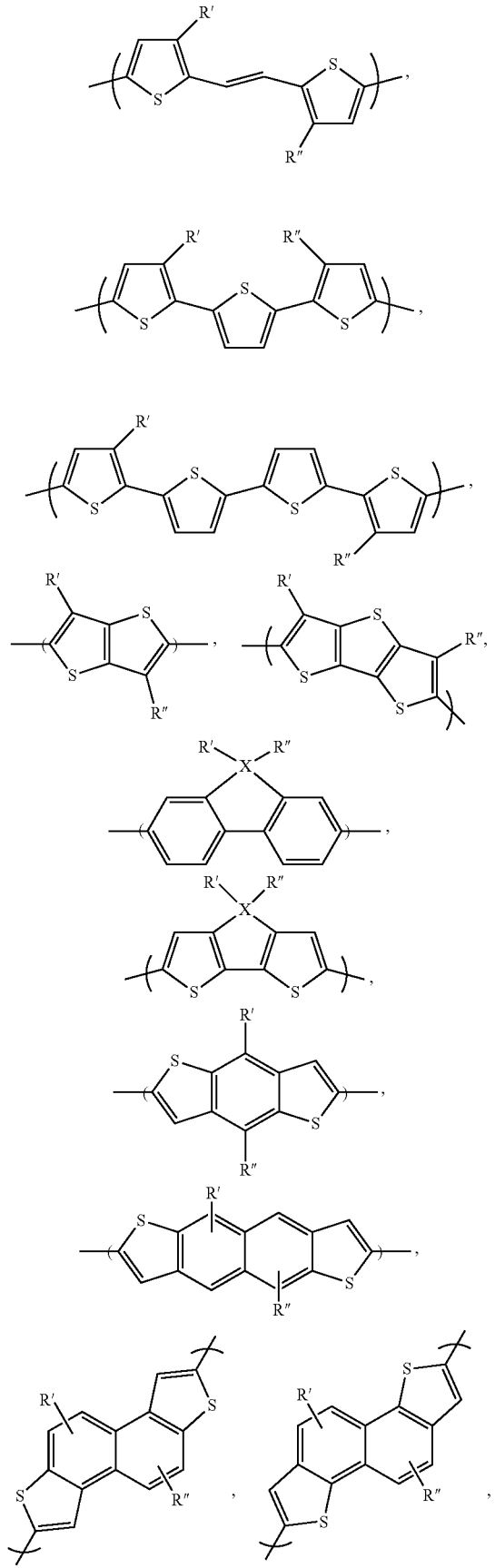

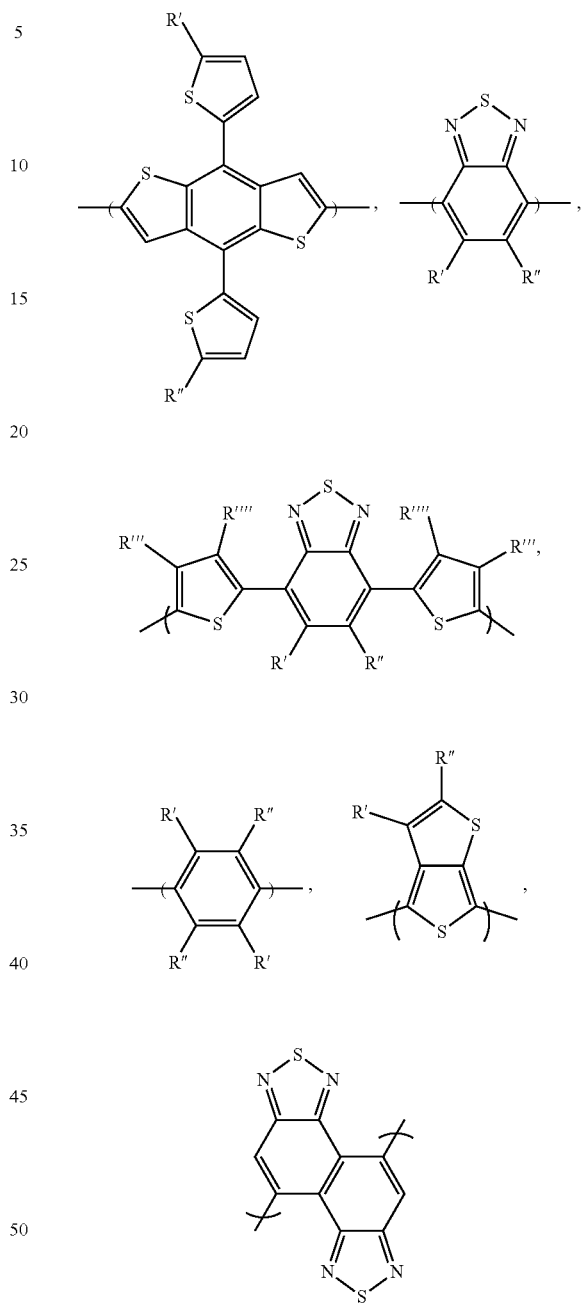

and combinations thereof, wherein R' and R" are independently selected from the group consisting of: H, Cl, F, CN, alkyl, alkoxy, alkylthio, ester, ketone and aryl groups.

3. The copolymer of claim 1, wherein the copolymer is regio-random.

4. The copolymer of claim 1, wherein the copolymer is regio-regular.

5. The copolymer of claim 1, wherein the aryl group is a 3,3'difluror-2,2'- bithiophene.

6. The copolymer of claim 1, wherein the copolymer comprises repeat unit E:

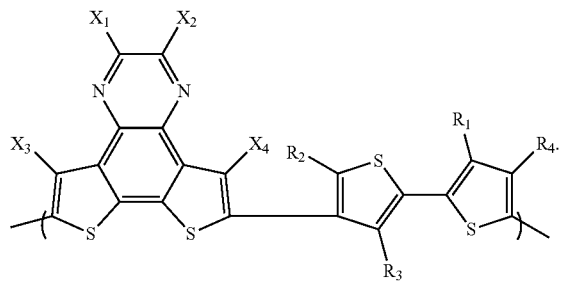

7. The copolymer of claim 1, wherein the copolymer comprises repeat unit H:

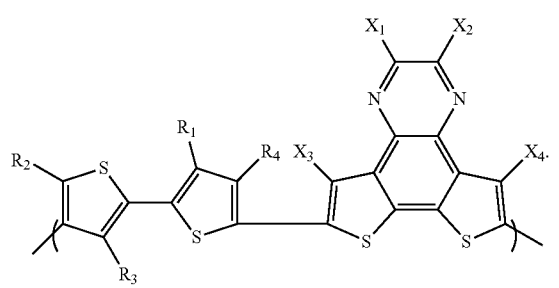

8. The copolymer of claim 1, wherein the copolymer comprises repeat unit J:

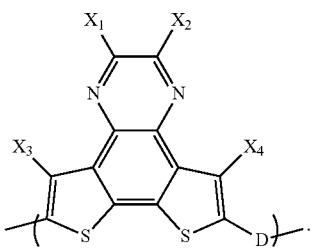

9. The copolymer of claim 1, wherein the copolymer comprises repeat unit K:

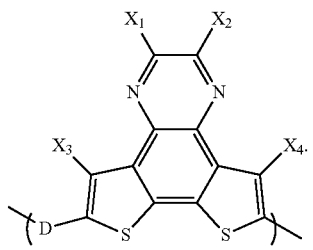

10. The copolymer of claim 1, wherein the copolymer is used as a photovoltaic material.
11. The copolymer of claim 1, wherein the copolymer is used as an active layer in an electronic device.
12. The copolymer of claim 1, wherein the number of repeat units A, B and C range from about 3 to about 10,000.
13. The copolymer of claim 1, wherein the copolymer forms a polymer bandgap greater than 1.8 eV.
14. The copolymer of claim 12, wherein the aryl group is selected from the group consisting of:

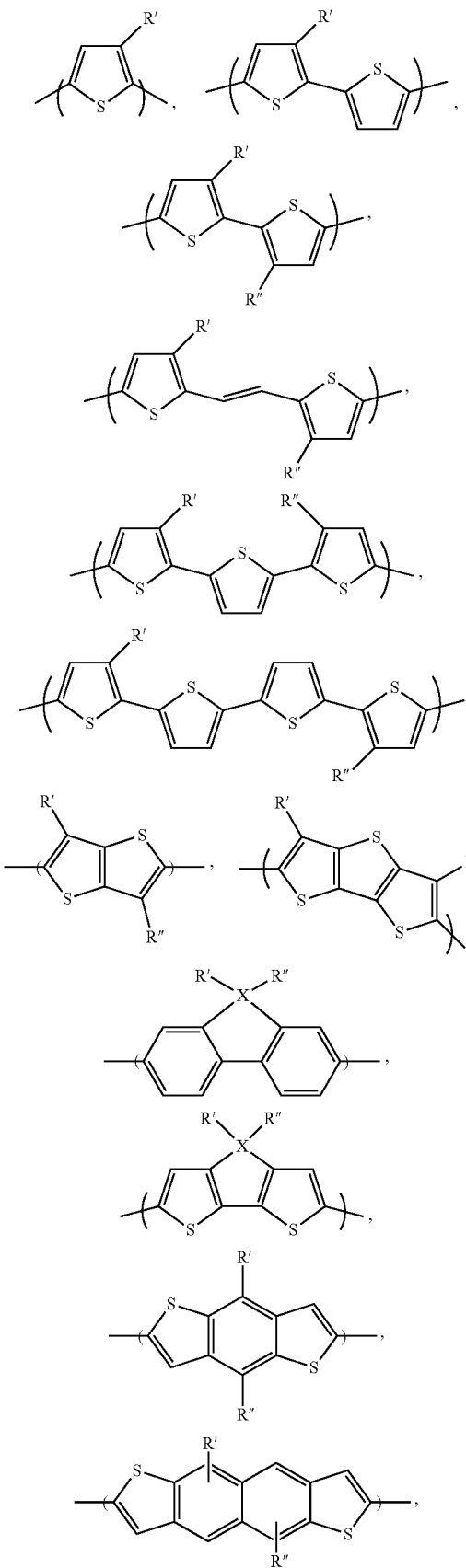

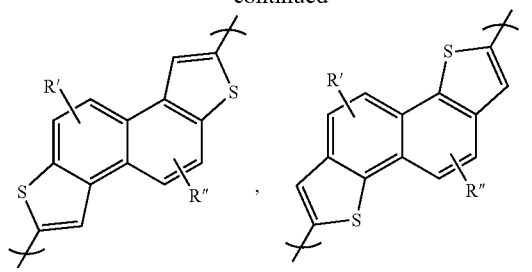
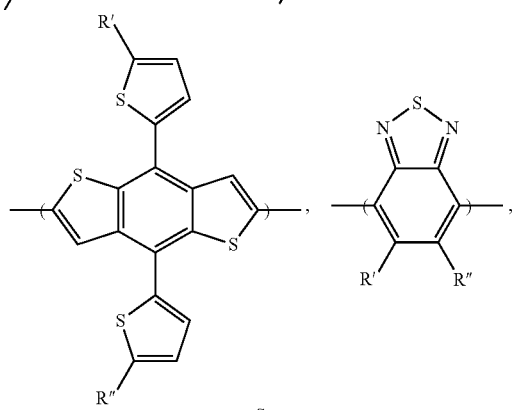
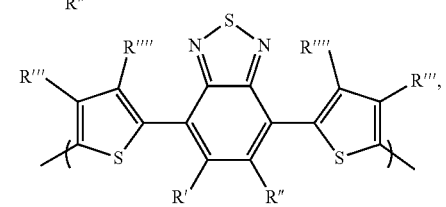
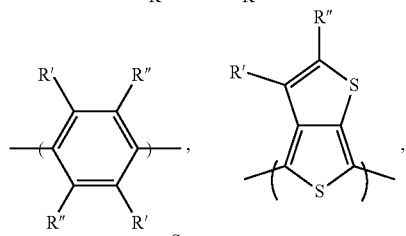
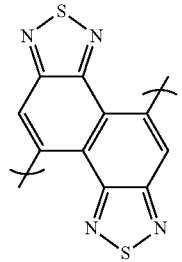
and combinations thereof, wherein R' and R" are independently selected from the group consisting of: H, Cl, F, CN, alkyl, alkoxy, alkylthio, ester, ketone and aryl groups.
15. The copolymer of claim 12, wherein the aryl group is selected from the group consisting of:
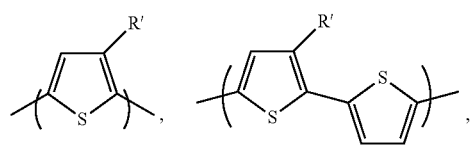
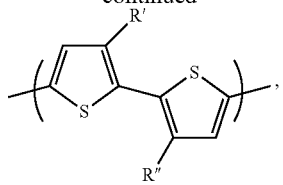
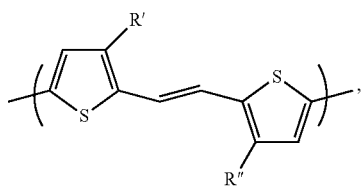
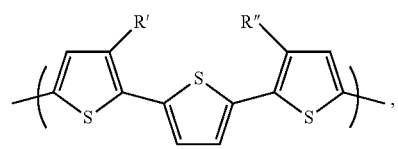
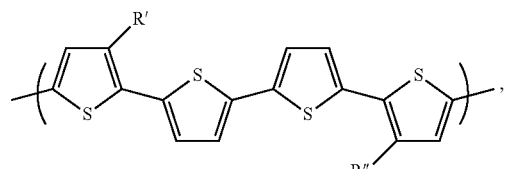
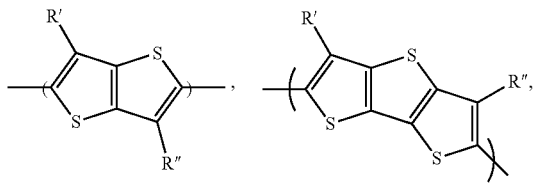
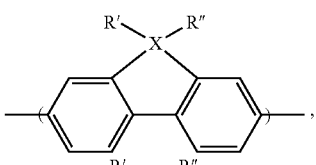
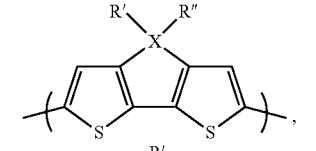
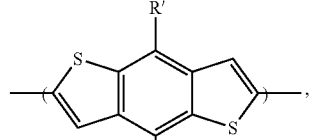
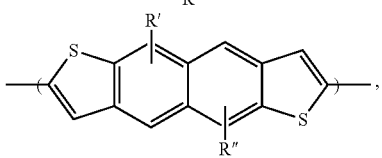

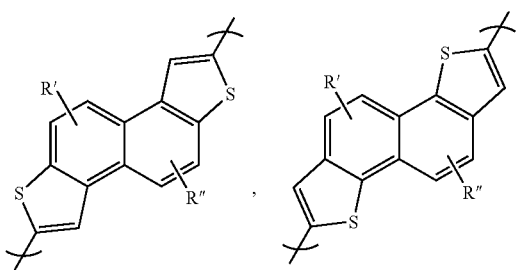
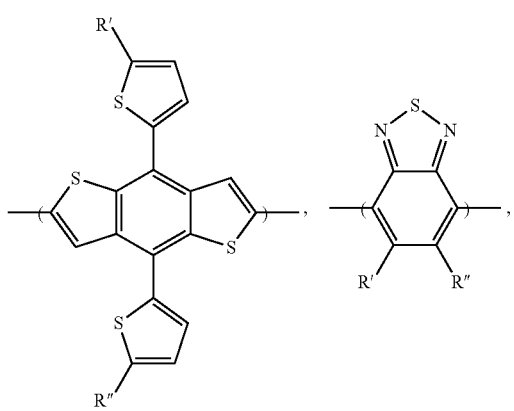
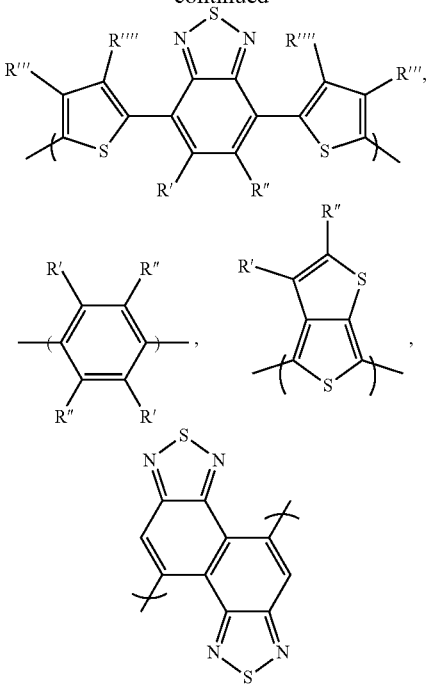
and combinations thereof, wherein R' and R" are independently selected from the group consisting of: H, Cl, F, CN, alkyl, alkoxy, alkylthio, ester, ketone and aryl groups.
* * * * *